US012685085B2

(12) United States Patent
Chadha et al.

(10) Patent No.: US 12,685,085 B2
(45) Date of Patent: Jul. 14, 2026

(54) FEATURE CREATION IN SUBSTRATE SUPPORTS

(71) Applicant: Applied Materials, Inc., Santa Clara, CA (US)

(72) Inventors: Arvinder Manmohansingh Chadha, San Jose, CA (US); Gagandeep Singh Joshi, Fresno, CA (US); Joseph Frederick Sommers, Roseville, CA (US); Joseph Frederick Behnke, San Jose, CA (US); Christopher Laurent Beaudry, San Jose, CA (US); Wei-Sheng Lei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 18/626,996

(22) Filed: Apr. 4, 2024

(65) Prior Publication Data

US 2025/0316519 A1 Oct. 9, 2025

(51) Int. Cl.
| | |
|---|---|
| *H01L 21/683* | (2006.01) |
| *B23K 26/00* | (2014.01) |
| *B23K 26/352* | (2014.01) |
| *H10P 72/72* | (2026.01) |
| *H10P 72/76* | (2026.01) |
| *B23K 103/00* | (2006.01) |

(52) U.S. Cl.
CPC ........ *H10P 72/722* (2026.01); *B23K 26/0006* (2013.01); *B23K 26/355* (2018.08); *H10P 72/7616* (2026.01); *B23K 2103/52* (2018.08)

(58) Field of Classification Search
CPC ............ B23K 26/0823; B23K 26/0006; B23K 26/0622; B23K 26/402; B23K 26/355; B23K 2103/52; H01L 21/6833; H01L 21/68757
See application file for complete search history.

(56) References Cited

U.S. PATENT DOCUMENTS

| | | |
|---|---|---|
| 2010/0159712 A1 | 6/2010 | Steger |
| 2016/0354864 A1 | 12/2016 | Hammer et al. |
| 2023/0086253 A1* | 3/2023 | Lee ........................ C09J 133/08 |
| | | 438/464 |
| 2023/0195060 A1 | 6/2023 | Shah et al. |
| 2023/0294208 A1 | 9/2023 | Parkhe |

FOREIGN PATENT DOCUMENTS

| | | |
|---|---|---|
| KR | 102342426 B1 | 12/2021 |
| KR | 20230041862 A | 3/2023 |

OTHER PUBLICATIONS

International Search Report and Written Opinion for International Application No. PCT/US2025/023003, mailed Jul. 22, 2025, 11 Pages.

* cited by examiner

*Primary Examiner* — Monica A Huson
(74) *Attorney, Agent, or Firm* — Lowenstein Sandler LLP

(57) ABSTRACT

A method includes receiving a ceramic plate of a substrate support system. The method further includes determining a feature pattern for a surface of the ceramic plate. The method further includes performing laser material processing of the surface of the ceramic plate to form the feature pattern comprising a plurality of features on the surface of the ceramic plate.

15 Claims, 10 Drawing Sheets

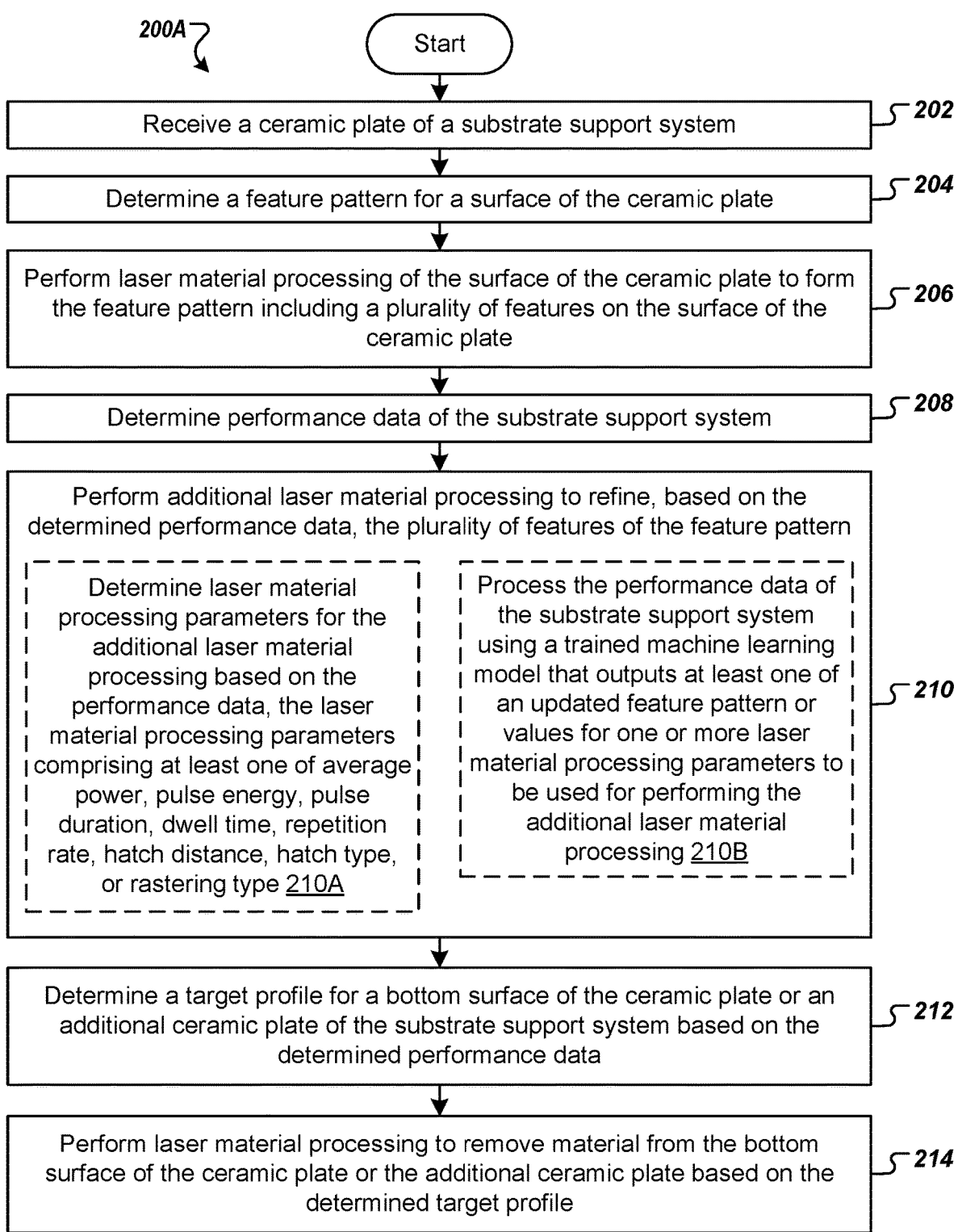

200A

Start

Receive a ceramic plate of a substrate support system ⟋ 202

Determine a feature pattern for a surface of the ceramic plate ⟋ 204

Perform laser material processing of the surface of the ceramic plate to form the feature pattern including a plurality of features on the surface of the ceramic plate ⟋ 206

Determine performance data of the substrate support system ⟋ 208

Perform additional laser material processing to refine, based on the determined performance data, the plurality of features of the feature pattern Determine laser material processing parameters for the additional laser material processing based on the performance data, the laser material processing parameters comprising at least one of average power, pulse energy, pulse duration, dwell time, repetition rate, hatch distance, hatch type, or rastering type 210A Process the performance data of the substrate support system using a trained machine learning model that outputs at least one of an updated feature pattern or values for one or more laser material processing parameters to be used for performing the additional laser material processing 210B

⟋ 210

Determine a target profile for a bottom surface of the ceramic plate or an additional ceramic plate of the substrate support system based on the determined performance data ⟋ 212

Perform laser material processing to remove material from the bottom surface of the ceramic plate or the additional ceramic plate based on the determined target profile ⟋ 214

Start

Receive a used ceramic plate of a substrate support system having a feature pattern including a plurality of features on of a surface of the used ceramic plate    *222*

Perform laser material processing to remove at least a portion of the plurality of features    *224*

Form a new feature pattern on the surface of the used ceramic plate    *226*

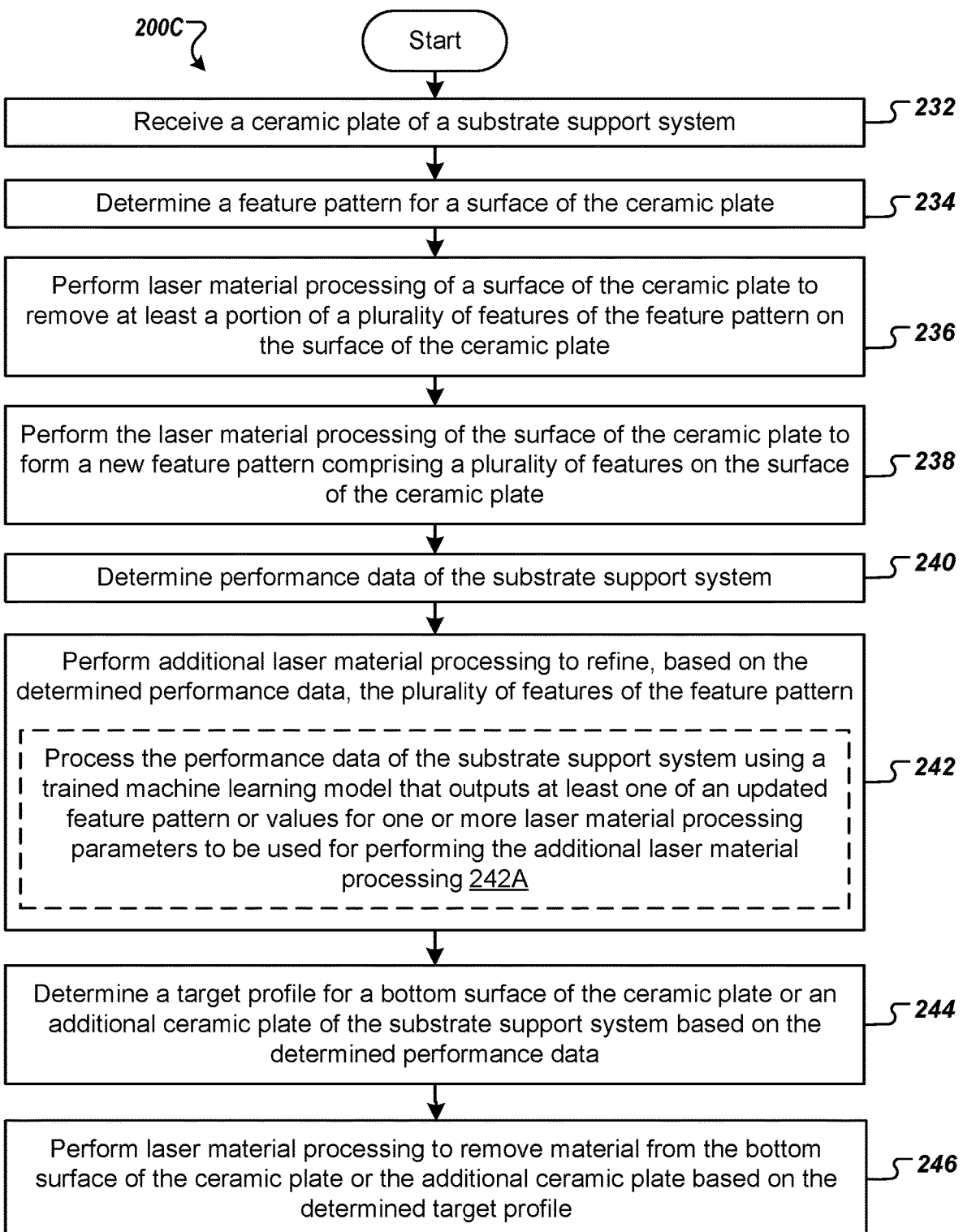

200C

Start

Receive a ceramic plate of a substrate support system _⟋232

Determine a feature pattern for a surface of the ceramic plate _⟋234

Perform laser material processing of a surface of the ceramic plate to remove at least a portion of a plurality of features of the feature pattern on the surface of the ceramic plate _⟋236

Perform the laser material processing of the surface of the ceramic plate to form a new feature pattern comprising a plurality of features on the surface of the ceramic plate _⟋238

Determine performance data of the substrate support system _⟋240

Perform additional laser material processing to refine, based on the determined performance data, the plurality of features of the feature pattern Process the performance data of the substrate support system using a trained machine learning model that outputs at least one of an updated feature pattern or values for one or more laser material processing parameters to be used for performing the additional laser material processing 242A _⟋242

Determine a target profile for a bottom surface of the ceramic plate or an additional ceramic plate of the substrate support system based on the determined performance data _⟋244

Perform laser material processing to remove material from the bottom surface of the ceramic plate or the additional ceramic plate based on the determined target profile _⟋246

600

Design Generation System 610

Server Machine 680

Training Engine 682

Validation Engine 684

Testing Engine 686

Selection Engine 685

Server Machine 670

Data Set Generator 672

Model 690

Design Generation Server 612

Design Generation Component 614

Data Store 640

Design Data 642

Historical Design Data 644

Current Design Data 646

Performance Data 652

Historical Performance Data 654

Current Performance Data 656

Design Generation Data 660

Network 630

Manufacturing Equipment 624

Design Generation Component 614

Sensors 626

Client Device 620

Design Generation Component 614

FIG. 6

FEATURE CREATION IN SUBSTRATE SUPPORTS

TECHNICAL FIELD

The present disclosure generally relates to systems and methods for feature creation in substrate supports. More particularly, the present disclosure relates to systems and methods for feature creation (e.g., on ceramic plates) for substrate support systems of semiconductor manufacturing systems.

BACKGROUND

Semiconductor manufacturing processes can involve the use of substrate support systems (e.g., electrostatic chucks, heaters, vacuum chucks, etc.) to secure and handle substrates such as semiconductor wafers through fabrication stages. The performance and longevity of substrate support systems can influence the performance of substrate manufacturing systems as well as the quality and reliability of the manufactured semiconductor devices.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a method includes receiving a ceramic plate of a substrate support system. The method further includes determining a feature pattern for a surface of the ceramic plate. The method further includes performing laser material processing of the surface of the ceramic plate to form the feature pattern comprising a plurality of features on the surface of the ceramic plate.

In another aspect of the disclosure, a method includes receiving a ceramic plate of a substrate support system. The method further includes determining a feature pattern for a surface of the ceramic plate. The method further includes performing laser material processing of a surface of the ceramic plate to remove at least a portion of a plurality of features of the feature pattern on the surface of the ceramic plate. The method further includes performing the laser material processing of the surface of the ceramic plate to form a new feature pattern comprising a plurality of features on the surface of the ceramic plate.

In another aspect of the disclosure, a system includes a memory and a processing device coupled to the memory. The processing device is to determine a feature pattern for a surface of a ceramic plate of a substrate support system, the feature pattern including a plurality of features on a surface of the ceramic plate. The processing device is further to cause a laser material processing system to perform laser material processing of the surface of the ceramic plate to form the feature pattern on the surface of the ceramic plate.

BRIEF DESCRIPTION OF THE DRAWINGS

The present disclosure is illustrated by way of example, and not by way of limitation in the figures of the accompanying drawings.

FIGS. 2A-C are flow diagrams of methods associated with feature creation on the surface of a ceramic plate, according to some embodiments.

FIG. 5 illustrates applying a solvent soluble film to the surface of a ceramic plate of a substrate support prior to performing laser material processing on the ceramic plate, according to some embodiments.

FIG. 6 is a block diagram illustrating an example system architecture, according to certain embodiments.

DETAILED DESCRIPTION

Figure 1:
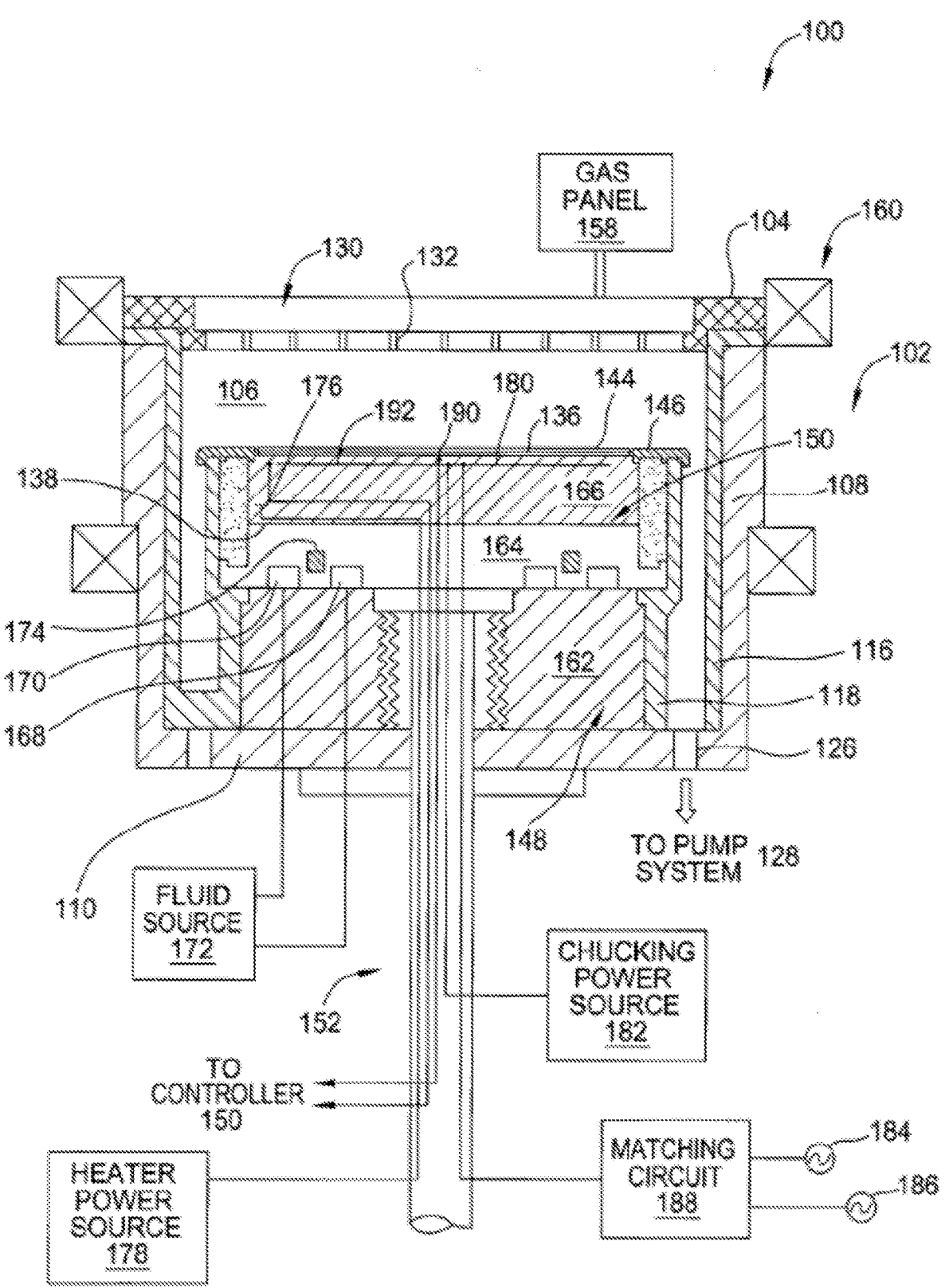
FIG. 1 depicts a sectional side view of a processing chamber, according to some embodiments.

In electronic device manufacturing (e.g., such as semiconductor manufacturing), substrate support systems are used for holding and releasing substrates (e.g., wafers) during various fabrication processes. Electrostatic chucks employ electrostatic force, generated through an applied voltage, to clamp substrates (e.g., semiconductor wafers) during processes such as etching, chemical vapor deposition (CVD), physical vapor deposition (PVD), etc. Other types of chucks, heaters, and other substrate supports may also hold or chuck substrates during processing. To facilitate this, electrostatic chucks and other substrate supports incorporate a variety of surface features (e.g., mesas, grooves, channels, sealing bands or rings, etc.) to support substrates during fabrication processes. The features can be formed on a ceramic plate that is, or is part of, the substrate support.

Conventionally, the formation of features on the surface of ceramic plates can be achieved bead blasting, which sculpts target topographical features into the surface of the ceramic plates by propelling an abrasive material toward a target (e.g., the ceramic plates) at high speed using compressed air. Bead blasting may be used to form features such as mesas and sealing bands, for example. Mechanical grinding and/or drilling may also be performed on ceramic plates to shape the ceramic plates and/or form holes in the ceramic plates (e.g., such as holes for flowing a gas such as Helium). These techniques can lack precision and can cause damage to the surface of the ceramic plate. For example, bead blasting can introduce macro cracks in regions between the features (e.g., mesas). Cracks between mesas on an electrostatic chuck can significantly impair the performance of the electrostatic chuck by creating particle gettering areas and/or particle traps. Gettering in electronic device manufacturing (e.g., such as semiconductor manufacturing) can refer to the trapping of contaminants and electrical charges in cracks or defects on a surface. In the context of substrate support systems, gettering areas (e.g., on a surface of a substrate support system such as an electrostatic chuck) can disrupt electrostatic clamping and lead to defects in semiconductor devices. Particles traps can also trap contaminants and electrical charges in cracks or defects on a surface of a substrate support system, disrupting electrostatic clamping and leading to defects in semiconductor devices.

These cracks can further disrupt the uniform distribution of electrostatic clamping force for securely holding substrates, which can result in substrate slippage or misalignment and adversely affect the precision of fabrication processes. Over time, the cracks introduced by the bead blasting can lead to material flaking, altering the electrostatic properties of the chuck or other substrate support, which in turn negatively affects chucking and de-chucking performance. Furthermore, the cracks can act as charge collectors, potentially inducing residual charges in the substrates or backside films. This can result in the formation of particle traps and/or gettering centers on the substrates and can impact subsequent lithography steps, compromising the integrity and performance of the semiconductor devices being manufactured.

Following bead blasting of a ceramic plate, polishing and/or grinding processes can be applied to the features to refine their surfaces. However, this polishing or grinding step lacks precision, potentially leading to variability in feature geometry and surface finish. The variability in feature geometry and surface finish can interfere with effective thermal management, causing uneven heat distribution that impacts process uniformity and device quality.

Throughout the lifespan of an electrostatic chuck or other substrate support, the surfaces of the features (e.g., top surfaces of mesas) and the surfaces between the features can erode and become damaged (e.g., due to repeated thermal cycling). However, current refurbishment practices can be limited to only two refurbishment cycles. This limitation stems from the amount of material removed during the refurbishment process. Mechanical grinding can be used to remove damaged material and can result in the excessive removal of material, often exceeding 30 to 40 micrometers, which can diminish the operational lifespan of the electrostatic chuck or other substate support.

Additionally, mechanical drilling used in the creation of certain features on ceramic plates (e.g., holes) leads to the accumulation of debris around boundary regions. While acid treatment can be employed to remove the debris, it risks widening the features (e.g., holes) beyond the intended dimensions and can introduce micro-chips. These micro-chips, exacerbated by thermal cycling from the substrate, may manifest as particles over the life of the electrostatic chuck or other substrate support, further compromising the performance and reliability of the electrostatic chuck or other substrate support.

Aspects and implementations of the present disclosure address these and other challenges of the existing technology by providing systems and methods for performing laser material processing to create features on a ceramic plate of a substrate support system (e.g., of an electrostatic chuck). A substrate support system such as an electrostatic chuck can include one or multiple ceramic plates where feature patterns can be formed or surface profiles can be created. A feature pattern on a surface of a ceramic plate of a substrate support can include features such as mesas that provide support and stability to substrates while ensuring proper alignment and facilitating uniform electrostatic clamping force across the substrates during manufacturing processes.

In some embodiments, laser material processing can be used to form a feature pattern or a target profile on a ceramic plate of a substrate support system. Laser material processing can also be used to remove features from the ceramic plate for the purpose of refurbishment. By using laser material processing the number of refurbishments per ceramic plate can be increased due to the ability to remove precise and lesser amounts of material using laser material processing. This precision also allows for formation of features on the surface of the ceramic plate that are, for example, a freeform polynomial shape or a linear approximation of a freeform polynomial shape.

Feature patterns can also include features that help manage the thermal performance of the electrostatic chuck and/or the wafer supported by it. For example, a bottom surface of a ceramic plate of a substrate support system can have a surface profile. A surface profile can include a profile shape of the bottom surface or a portion of the bottom surface. For example, a profile can include a freeform polynomial shape or a linear approximation of a freeform polynomial shape. By determining performance data, such as a thermal response, of the substrate support system, additional laser material processing can be performed to refine the features (e.g., based on the performance data) or refine the surface profile shape to a target profile shape (e.g., based on the performance data). Such refinement may be performed by changing a shape of a top surface of a substrate support, of a bottom surface of the substrate support, and/or of one or more features of the substrate support. For example, a profile of a bottom surface and/or a top surface of a ceramic plate of an electrostatic chuck can be refined by laser material processing based on a thermal response of the electrostatic chuck or substrates positioned on the electrostatic chuck. Laser material processing parameters can also be determined for the additional laser material processing based on the performance data. Laser material processing parameters can be, for example, average power, pulse energy, pulse duration, dwell time, repetition rate, hatch distance, hatch type, rastering type, etc. In some embodiments, Tunable laser material processing parameters can also allow for reduced kinking in rastering schemes.

In embodiments, performance data of a substrate support system can be collected after features are formed on a top ceramic plate (e.g., electrostatic chuck) of the substrate support system. One or more substrates may be processed while supported by the substrate support system, and measurements may be generated of the substrates during and/or after processing. Examples of such measurements include temperature measurements of regions of the substrate, thickness measurements of regions of the substrate, reflectance measurements of regions of the substrate, and so on. Measurements may be generated, for example, using a reflectometry, spectroscopy, temperature sensors, other optical sensors, and so on. Measurements may be generated over multiple points on the substrate to generate a profile of the substrate. The measurements (e.g., profile of the substrate) may be processed using a trained machine learning model in some embodiments. The trained machine learning model may output an updated feature pattern or values for laser material processing parameters to be used for performing the additional laser material processing of the ceramic plate. This may include changing sizes, heights, shapes, etc. of one or more features on a top surface of the ceramic plate. The trained machine learning model may additionally or alternatively output a new target shape for a bottom surface of the ceramic plate or another ceramic plate of a substrate support assembly and/or may output parameters to use in laser processing to achieve the new target shape for the bottom surface. In some embodiments, the trained machine learning model can be trained using training input data including historical performance data and training target output data including historical design data associated with the historical performance data.

Aspects and implementations of the present disclosure can enable enhanced precision in manufacturing of substrate supports (e.g., in formation of surface features on substrate supports) and can reduce cracking in regions between features (e.g., mesas) of substrate supports. Reduced cracking can reduce material flaking and help to maintain the desired electrostatic properties of the substrate support, which in turn improves chucking and de-chucking performance. Aspects and implementations of the present disclosure can improve the performance of substrate supports by limiting particle traps and charge gettering areas, leading to reduced residual charges in the wafers or backside films, improved execution of subsequent lithography steps, and reduced defects in manufactured semiconductor devices as compared to substrate supports formed using traditional techniques such as bead blasting, grinding, and mechanical drilling. Aspects and implementations of the present disclosure can enable uniform distribution of electrostatic clamping force for securely holding wafers using electrostatic chucks, resulting in reduced wafer slippage and improved alignment. Aspects and implementations of the present disclosure can enhance thermal management of substrates, enabling even heat distribution across secured substrates and improving process uniformity and device quality.

Aspects and implementations of the present disclosure can increase precision during feature refinement of surface features in substrate supports, leading to more consistency in feature geometry and surface finish. For example, throughout the lifespan of an electrostatic chuck, the surfaces of the features (e.g., top surfaces of mesas) and the surfaces between the features can erode and become damaged. Aspects and implementations of the present disclosure can increase the amount of refurbishment cycles possible during the lifetime of an electrostatic chuck or ceramic plate of an electrostatic chuck. Aspects and implementations of the present disclosure can reduce the amount of material removed during the refurbishment process, resulting in the reduced removal of material, which increases the operational lifespan of the electrostatic chuck and also improves the performance reliability.

Additionally, aspects and implementations of the present disclosure can reduce micro chipping and the accumulation of debris around boundary regions (e.g., associated with acid treatments) without widening features (e.g., holes) beyond the intended dimensions.

FIG. 1 is a sectional view of one embodiment of a semiconductor processing chamber 100 having an electrostatic chuck assembly 150 disposed therein. The electrostatic chuck assembly 150 includes an electrostatic puck (puck 166) having surface features (e.g., mesas, a seal band, gas delivery holes, etc.) formed using laser material processing, as will be discussed in greater detail below.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as C2F6, SF6, SiCl4, HBr, NF3, CF4, CHF3, CH2F3, Cl2 and SiF4, among others, and other gases such as O2, or N2O. Examples of carrier gases include N2, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

A substrate support assembly 148 is disposed in the interior volume 106 of the processing chamber 100 below the gas distribution assembly 130. The substrate support assembly 148 holds a substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and electrostatic chuck assembly 150. In one embodiment, the electrostatic chuck assembly 150 further includes a thermally conductive base referred to herein as a cooling plate 164 coupled to an electrostatic puck (referred to hereinafter as a puck 166). The electrostatic chuck assembly 150 described in embodiments may be used for Johnsen-Rahbek and/or Coulombic electrostatic chucking.

In one embodiment, a protective ring 146, which may be referred to as a process kit ring, is disposed over a portion of the puck 166 and/or at an outer perimeter of the puck 166. In one embodiment, the puck 166 is coated with a protective layer 136. Alternatively, the puck 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZrxO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The puck 166 may include a single ceramic plate or multiple ceramic plates. For example, the puck 166 may include an upper puck plate (e.g., a ceramic plate) (not shown) and a lower puck plate (e.g., a ceramic plate) (not shown) bonded by a metal bond, a diffusion bond, an organic bond, and/or other type of bond. The ceramic plate may be a dielectric or electrically insulative material (e.g., having an electrical resistivity of greater than 1014 Ohm·meter) that is usable for semiconductor processes at temperatures of 180° C. and above. In one embodiment, the ceramic plate is composed of materials usable from about 20° C. to about 500° C. In one embodiment, the ceramic plate is AlN. The AlN ceramic plate may be undoped or may be doped. For example, the AlN may be doped with Samarium oxide ($Sm_2O3$), Cerium oxide ($CeO_2$), Titanium dioxide ($TiO_2$), or a transition metal oxide. In one embodiment, the ceramic plate is $Al_2O_3$. The $Al_2O_3$ ceramic plate may be undoped or may be doped. For example, the $Al_2O_3$ may be doped with Titanium dioxide ($TiO_2$) or a transition metal oxide.

The mounting plate 162 is coupled to the bottom 110 of the chamber body 102 and includes passages for routing utilities (e.g., fluids, power lines, sensor leads, etc.) to the cooling plate 164 and the puck 166. The cooling plate 164 and/or puck 166 may include one or more optional embedded heating elements 176, optional embedded thermal isolators 174 and/or optional conduits 168, 170 to control a lateral temperature profile of the substrate support assembly 148. In one embodiment, a thermal gasket 138 is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The conduits 168, 170 and embedded heating elements 176 may be utilized to control the temperature of the puck 166, thereby heating and/or cooling the puck 166 and a substrate (e.g., a wafer) being processed. In one embodiment, the puck 166 includes two separate heating zones that can maintain distinct temperatures. In another embodiment, the puck 166 includes four different heating zones that can maintain distinct temperatures.

Alternatively, the puck 166 may include greater or fewer heating zones. The temperature of the electrostatic puck 166 and the thermally conductive base may be monitored using multiple temperature sensors 190, 192, which may be monitored using a controller 150.

The puck 166 may further include multiple gas passages such as grooves, mesas and other surface features that may be formed in an upper surface of the puck 166. The gas passages may be fluidly coupled to a source of a heat transfer (or backside) gas, such as He via holes drilled in the puck 166. In operation, the backside gas may be provided at controlled pressure into the gas passages to enhance the heat transfer between the puck 166 and the substrate 144. Features such as the gas passages, grooves, mesas, sealing band, etc. may be formed using laser material processing in embodiments.

In one embodiment, the puck 166 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

In some embodiments, substrate support assembly 148 can include a feature pattern formed in a surface of the puck 166 (e.g., for ensuring proper alignment and facilitating uniform electrostatic clamping force across substrate 144 during manufacturing processes). In some embodiments, laser material processing can be used to form a feature pattern on a ceramic plate of substrate support assembly 148. Laser material processing can also be used to remove features from the ceramic plate for the purpose of refurbishment. By using laser material processing the number of refurbishments per ceramic plate can be increased due to the ability to remove precise amounts of material using laser material processing.

Feature patterns can also include features that help manage the thermal performance of the substrate support assembly 148 and/or the substrate 144 (e.g., supported by substrate support assembly 148). For example, a bottom surface of ceramic plate of substrate support assembly 148 can have a profile shape. By determining performance data, such as a thermal response of substrate support assembly 148, additional laser material processing can be performed to refine the features of the puck 166 (e.g., based on the performance data) or refine the profile shape of the surface of the puck 166 to a target profile shape (e.g., based on the performance data).

Figure 2B:
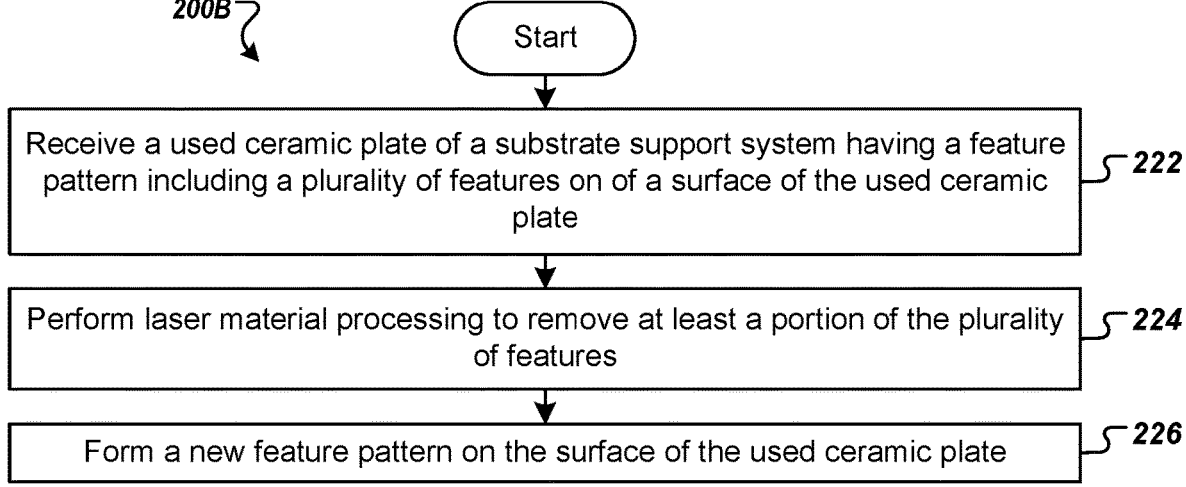

FIGS. 2A-C are flow diagrams of a methods associated with laser material processing for feature creation on a ceramic plate of a substrate support system, according to some embodiments. One or more operations of methods 200A-C may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, a non-transitory storage medium stores instructions that when executed by a processing device (e.g., of processing system, of) cause the processing device to perform one or more operations of one or more of methods 200A-C.

For simplicity of explanation, methods 200A-C are depicted and described as a series of operations. However, operations in accordance with this disclosure can occur in various orders and/or concurrently and with other operations not presented and described herein. Furthermore, not all illustrated operations may be performed to implement methods 200A-C in accordance with the disclosed subject matter. In addition, those skilled in the art will understand and appreciate that methods 200A-C could alternatively be represented as a series of interrelated states via a state diagram or events.

FIG. 2A is a flow diagram of a method 200A for performing laser material processing to create features on a ceramic plate of a substrate support system, according to certain embodiments.

Referring to FIG. 2A, in some embodiments, at block 202 the processing logic implementing method 200A may cause a ceramic plate of a substrate support system to be received at a laser material processing station or tool. In an embodiment, a robot arm places the ceramic plate at a laser material processing station. Alternatively, the ceramic plate may be manually placed at a laser material processing station.

At block 204, the processing logic determines a feature pattern for a surface of the ceramic plate. In an embodiment, processing logic loads a digital file containing instructions for performing laser material processing of the ceramic plate into a laser material processing machine. The digital file may be prepared based on a digital 3D model of a surface pattern of the ceramic plate.

At block 206, the processing logic causes laser material processing of the surface of the ceramic plate to be performed. The performance of the laser material processing forms the feature pattern including a set of features on the surface of the ceramic plate. Laser material processing involves the use of focused laser beams to modify, cut, weld, or otherwise alter the properties of various materials. The process works through the interaction between the intense light of the laser and the material being processed. In laser material processing, laser light is generated by exciting atoms or molecules within a laser medium, such as a gas, solid-state crystal, or semiconductor. This excitation causes the atoms to emit photons in a coherent, narrow beam of light. The laser beam is typically focused using lenses or mirrors to concentrate its energy into a small spot to achieve high power density and precision in the material processing. When the focused laser beam interacts with the material, several processes can occur depending on the properties of both the laser and the material. Examples of processes include absorption, melting, vaporization, annealing, hardening, and chemical reactions. For examples, at high power densities, the absorbed energy of the laser can cause the processed material to melt or even vaporize. This is particularly useful for processes like laser cutting and drilling. Laser material processing often involves precise control of parameters such as laser power, pulse duration, repetition rate, and beam scanning speed. Monitoring systems may be employed to ensure consistent quality and accuracy in the processed parts. Laser material processing may be performed by moving a laser source and/or a ceramic plate being processed (e.g., by a support bed that may be movable in x, y and/or z. In some embodiments, the laser beam may have a fixed direction (e.g., may be vertical). In some embodiments, the direction of the laser beam may be variable, such as by rotating a laser source.

In performing laser material processing, rastering may be used. Rastering can refer to techniques of moving a laser beam in a pattern (e.g., a back-and-forth pattern) across a surface of a material to modify the material according to a specific design, such as in engraving or additive manufacturing. In some embodiments, rastering movement can be achieved through galvanometer (galvo) systems and/or movable wedge systems. Galvo systems can utilize fast-moving mirrors mounted on galvanometers to swiftly direct a laser beam in a desired pattern. Movable wedge systems can involve the physical movement of either the laser head or the material itself (e.g., through linear actuators or motors) to create the raster pattern. In some embodiments, a scan head of a laser material processing system may include an F-Theta lens to yield a specified beam spot size.

In laser material processing, hatch distance can refer to the spacing between adjacent raster lines, dictating the application density of a laser on a material and influencing the engraving depth, surface smoothness, and energy input. In some embodiments, a smaller hatch distance can result in greater overlap of laser paths for a more uniform treatment, whereas a larger distance allows for quicker processing with less intensity. In some embodiments, hatch type can describe the pattern or direction of the raster lines. For example, single-directional, where the laser moves back and forth in one direction, or cross-hatched patterns that apply laser paths in two perpendicular directions for even coverage. In some embodiments, by tuning laser material processing parameters while following a rastering pattern kinking in features can be reduced. For example, where a rastering pattern overlaps the laser can be momentarily turned off so the intersection is not processed twice creating a deeper engraving than desired.

In some embodiments, surfaces of one or more features of the set of features can include a freeform polynomial shape or a linear approximation of a freeform polynomial shape (e.g., a staircase approximation of a freeform polynomial shape). In some embodiments, surfaces of regions between one or more features of the set of features can include a freeform polynomial shape or a linear approximation of a freeform polynomial shape (e.g., a staircase approximation of a freeform polynomial shape). In some embodiments, the freeform polynomial shape or the linear approximation of a freeform polynomial shape can be periodic (e.g., repeating a pattern) or aperiodic. In some embodiments, the freeform polynomial shape or the linear approximation of a freeform polynomial shape can be symmetrical or asymmetrical. In some embodiments, the target profile can be periodic (e.g., repeating a pattern) or aperiodic. In some embodiments, the target profile can be symmetrical or asymmetrical.

In some embodiments, a solvent soluble film may be applied to the surface of the ceramic plate prior to performing the laser material processing. The solvent soluble film can be, for example, water-soluble polymers such as polyethylene glycol, polyacrylamides, polyacrylic acid copolymer, polyvinyl alcohol, and/or the like. In some embodiments, the solvent soluble film can be organic polymers that dissolve, disperse, or swell in water and consequently change the physical properties of aqueous systems undergoing gelation or thickening. In some embodiments, the solvent soluble film can be a hydrophilic water-soluble synthetic polymer (e.g., polyvinyl alcohol). The mechanism that causes the solvent soluble film to be dissolved is a repeating hydroxyl unit that can be cross-linkable with interconnected hydrogen bonding.

At block 208, the processing logic determines performance data of the substrate support system. In one embodiment, performance data includes temperature profile data across a surface of a substrate during one or more test processes and/or product processes. In one embodiment, a process is performed on one or more substrates supported by the ceramic plate having the feature pattern. During and/or after the process, measurements may be made of multiple portions of the substrate to generate a surface profile of the substrate. In one embodiment, the performed process includes an etch process and/or a deposition process. Film thickness and/or other parameters of the substrate may be measured at multiple points after the process. In embodiments, a reflectometry device or other measurement and/or imaging device may be used to measure a surface of a substrate. This enables any issues such as film non-uniformity to be detected. Based on the multiple measurements, a profile such as a uniformity profile, a particle count profile, an optical constant profile, etc. across the surface of the substrate may be determined. Film thickness may be dependent on temperature for processes such as deposition and etch. Accordingly, variations in thickness on a measured substrate may be due to temperature variations across the substrate during processing.

At block 210, additional laser material processing is performed to refine, based on the determined performance data, the set of features of the feature pattern. In some embodiments, at block 210A the processing logic can determine laser material processing parameters for the additional laser material processing based on the performance data. In some embodiments, processing logic processes the performance data (e.g., temperature profile, film thickness profile, etc. of a substrate) to determine an updated surface profile of a ceramic plate for a substrate support. The surface profile may be for an upper surface of the ceramic plate, and may include changes in thickness, size and/or shape of features on the upper surface such as mesas, seal band, and so forth. Surface profile may additionally include size and/or shape of valleys between mesas, for gas delivery holes, and/or for other features. The surface profile may additionally or alternatively be for a lower surface of a ceramic plate (e.g., a surface that interfaces with a cooling plate). Processing logic may determine the new surface profile using processing logic, which may or may not include a trained machine learning model. For example, a thickness profile and/or temperature profile of a substrate may be input into a trained machine learning model, which may output a new surface profile for the ceramic plate that will smooth out or remove non-uniformities in the thickness profile and/or temperature profile of the substrate. Laser material processing parameters that will achieve the new surface profile may then be determined. The laser material processing parameters can include at least one of average power, pulse energy, pulse duration, dwell time, repetition rate, hatch distance, hatch type, or rastering type. In some embodiments, at block 210B the processing logic can process the performance data of the substrate support system using a trained machine learning model that outputs at least one of an updated feature pattern or values for one or more laser material processing parameters to be used for performing the additional laser material processing. The trained machine learning model can be trained using training input data including historical performance data and training target output data including historical design data associated with the historical performance data.

At block 212, the processing logic may determine a target profile for a bottom surface of the ceramic plate or an additional ceramic plate of the substrate support system based on the determined performance data of the substrate support system, as described above. In some embodiments, the target profile can be for a top or bottom surface of a cooling plate of the substrate support system. In some embodiments, the target profile can be a freeform polynomial shape or a linear approximation of a freeform polynomial shape (e.g., a staircase approximation of a freeform polynomial shape). In some embodiments, the freeform polynomial shape or the linear approximation of a freeform polynomial shape can be periodic (e.g., repeating a pattern) or aperiodic. In some embodiments, the freeform polynomial shape or the linear approximation of a freeform polynomial shape can be symmetrical or asymmetrical. In some embodiments, the target profile can be periodic (e.g., repeating a pattern) or aperiodic. In some embodiments, the target profile can be symmetrical or asymmetrical.

At block 214, laser material processing may be performed to remove material from the bottom surface of the ceramic plate or the additional ceramic plate based on the determined target profile.

FIG. 2B is a method 200B for feature removal and creation on a ceramic plate of a substrate support system using laser material processing, according to some embodiments.

Referring to FIG. 2B, at block 222 of method 200B, the processing logic may cause a used ceramic plate of a substrate support system to be received at a laser material processing station or tool. In an embodiment, a robot arm places the used ceramic plate at a laser material processing station. Alternatively, the used ceramic plate may be manually placed at a laser material processing station.

In some embodiments, determining to refurbish a ceramic plate of a substrate support system can include monitoring the performance of processed substrates or performance of the ceramic plate itself (e.g., a temperature profile of the ceramic plate). For example, in response to substrates falling below a threshold performance metric, refurbishment of the ceramic plate can be triggered. Performance data such as device yield and uniformity, alongside variations in thickness profiles of substrates, can signal wear of the ceramic plate. In some embodiments, by physically inspecting the ceramic disc (e.g., using an optical microscope, a scanning electron microscope, a profilometer, a 3D scanner, a laser scanner, etc.) refurbishment of the ceramic plate can be triggered. Physical inspections of the ceramic plate can identify signs of wear, and precise measurements assess feature degradation and surface conditions. In some embodiments, by adhering to a predefined maintenance schedules ceramic plate refurbishment can be triggered. A set maintenance schedule can be based, for example, on the operational lifespan of the plate, time in use, number of processing cycles, or total processing time accumulated by the ceramic plate.

In some embodiments, by using measurement from an optical microscope, a scanning electron microscope, a profilometer, a 3D scanner, a laser scanner, etc. a refurbishment profile can be determined. In some embodiments, by using the performance measurements of processed substrates or the ceramic plate itself a refurbishment profile can be determined.

In some embodiments, the used ceramic plate has a feature pattern including a set of features on of a surface of the used ceramic plate. In some embodiments, a used ceramic plate in an electrostatic chuck may exhibit wear such as surface scratches, erosion of features such as mesas, grooves, and channels, micro-cracks, and embedded particle contaminants, along with chemical surface alterations from exposure to process gases and chemicals. Used ceramic plates can be refurbished and restored to achieve desired performance for semiconductor manufacturing in embodiments.

At block 224, the processing logic causes laser material processing to be performed to remove at least a portion of the set of features. In one embodiment, performance data of the substrate support system can be determined. Performance data, as described with respect to FIG. 2A, can include reflectometry data or other measurement data and/or imaging data that represent measurements of the surface of a substrate. Based on the measurements of the set of features, a new feature pattern of the substrate can be generated. By determining performance data an amount of the set of features to removed can be determined before creating the new feature pattern. For example, measurements made of the substrate can be used to generate a surface profile of the substrate. A target surface profile can be shaped from the existing surface profile by removing, for example, only the top portion of the set of features.

At block 226, the processing logic causes a new feature pattern to be formed on the surface of the used ceramic plate. In some embodiments, the forming the new feature pattern on the surface of the used ceramic plate can be accomplished using laser material processing techniques.

As described above with respect to FIG. 2A, laser material processing can involve the use of focused laser beams to modify, cut, weld, or otherwise alter the properties of various materials. Laser material processing can involve control of parameters such as laser power, pulse duration, repetition rate, and beam scanning speed. In some embodiments, processing logic processes the performance data (e.g., temperature profile, film thickness profile, etc. of a substrate) to determine an updated feature pattern of the ceramic plate for substrate support. The updated feature pattern may be for an upper surface of the ceramic plate, and may include changes in thickness, size and/or shape of features on the upper surface such as mesas, seal band, and so forth. The feature pattern may additionally or alternatively be for a lower surface of a ceramic plate (e.g., a surface that interfaces with a cooling plate). Processing logic may determine the new feature pattern using processing logic, which may or may not include a trained machine learning model. For example, a thickness profile and/or temperature profile of a substrate may be input into a trained machine learning model, which may output a new feature pattern for the ceramic plate that will renew the ceramic plate and counteract wear on the ceramic plate. Laser material processing parameters that will achieve the new feature pattern may then be determined.

FIG. 2C is a method 200C for feature removal and creation on a ceramic plate of a substrate support system using laser material processing, according to some embodiments.

Referring to FIG. 2C, at block 232 of method 200C, the processing logic causes a ceramic plate of a substrate support system to be received.

At block 234, the processing logic determines a feature pattern for a surface of the ceramic plate. In an embodiment, processing logic loads a digital file containing instructions for performing laser material processing of the ceramic plate into a laser material processing machine. The digital file may be prepared based on a digital 3D model of a surface pattern of the ceramic plate.

At block 236, the processing logic causes performance of laser material processing of a surface of the ceramic plate to remove at least a portion of a set of features of the feature pattern on the surface of the ceramic plate. In one embodiment, performance data of the substrate support system can be determined. Performance data, as described with respect to FIG. 2A, can include temperature profile data across a surface of a substrate during one or more test processes and/or product processes. In one embodiment, a process is performed on one or more substrates supported by the ceramic plate having the feature pattern (e.g., a set of features). During and/or after the process, measurements may be made of multiple portions of the substrate. In embodiments, a reflectometry device or other measurement and/or imaging device may be used to measure a surface of a substrate. Based on the multiple measurements, a new feature pattern of the substrate can be generated. By determining performance data an amount of the set of features to removed can be determined before creating the new feature pattern. For example, measurements made of multiple portions of the substrate can be used to generate a surface profile of the substrate. A target surface profile can be shaped from the existing surface profile by removing, for example, only the top portion of the set of features.

At block 238, the processing logic causes performance of the laser material processing of the surface of the ceramic plate to form a new feature pattern including a set of features on the surface of the ceramic plate. As described above with respect to FIG. 2A, laser material processing can involve the use of focused laser beams to modify, cut, weld, or otherwise alter the properties of various materials. Laser material processing can involve control of parameters such as laser power, pulse duration, repetition rate, and beam scanning speed. In some embodiments, the new feature pattern can be formed using remaining portions of the set of features that were not removed.

At block 240, the processing logic determines performance data of the substrate support system. As described above with respect to FIG. 2A, in one embodiment, performance data includes temperature profile data across a surface of a substrate during one or more test processes and/or product processes. In one embodiment, a process is performed on one or more substrates supported by the ceramic plate having the feature pattern. During and/or after the process, measurements may be made of multiple portions of the substrate to generate a surface profile of the substrate. In one embodiment, the performed process includes an etch process and/or a deposition process. Film thickness and/or other parameters of the substrate may be measured at multiple points after the process. In embodiments, a reflectometry device or other measurement and/or imaging device may be used to measure a surface of a substrate. This enables any issues such as film non-uniformity to be detected. Based on the multiple measurements, a profile such as a uniformity profile, a particle count profile, an optical constant profile, etc. across the surface of the substrate may be determined. Film thickness may be dependent on temperature for processes such as deposition and etch. Accordingly, variations in thickness on a measured substrate may be due to temperature variations across the substrate during processing.

At block 242, the processing logic causes performance of additional laser material processing to refine, based on the determined performance data, the set of features of the feature pattern. In some embodiments, processing logic processes the performance data (e.g., temperature profile, film thickness profile, etc. of a substrate) to determine an updated surface profile of a ceramic plate for a substrate support. The surface profile may be for an upper surface of the ceramic plate, and may include changes in thickness, size and/or shape of features on the upper surface such as mesas, seal band, and so forth. Surface profile may additionally include size and/or shape of valleys between mesas, for gas delivery holes, and/or for other features. The surface profile may additionally or alternatively be for a lower surface of a ceramic plate (e.g., a surface that interfaces with a cooling plate).

In some embodiments, at block 242A, the processing logic processes the performance data of the substrate support system using a trained machine learning model that outputs at least one of an updated feature pattern or values for one or more laser material processing parameters to be used for performing the additional laser material processing. Processing logic may determine a new surface profile using processing logic, which may include a trained machine learning model. For example, a thickness profile and/or temperature profile of a substrate may be input into a trained machine learning model, which may output a new surface profile for the ceramic plate that will smooth out or remove non-uniformities in the thickness profile and/or temperature profile of the substrate. Laser material processing parameters that will achieve the new surface profile may then be determined. In some embodiments, the trained machine learning model can be trained using training input data including historical performance data and training target output data including historical design data associated with the historical performance data. In some embodiments, design data can be data representing the current design (e.g., feature pattern) on the ceramic plate. In some embodiments, performance data can be data representing a thermal profile of the ceramic plate and/or a substrate supported by the substrate support system.

At block 244, the processing logic determines a target profile for a bottom surface of the ceramic plate or an additional ceramic plate of the substrate support system based on the determined performance data. In some embodiments, determining the target profile for the bottom surface of the ceramic plate or an additional ceramic plate of the substrate support system can use processing logic, which may include a trained machine learning model. For example, a thickness profile and/or temperature profile of a substrate may be input into a trained machine learning model, which may output a new bottom surface profile (e.g., target profile) for the ceramic plate that will smooth out or remove non-uniformities in the thickness profile and/or temperature profile of the substrate. Laser material processing parameters that will achieve the new surface profile (e.g., target profile) may then be determined.

At block 246, the processing logic causes performance of laser material processing to remove material from the bottom surface of the ceramic plate or the additional ceramic plate based on the determined target profile.

Figure 3:
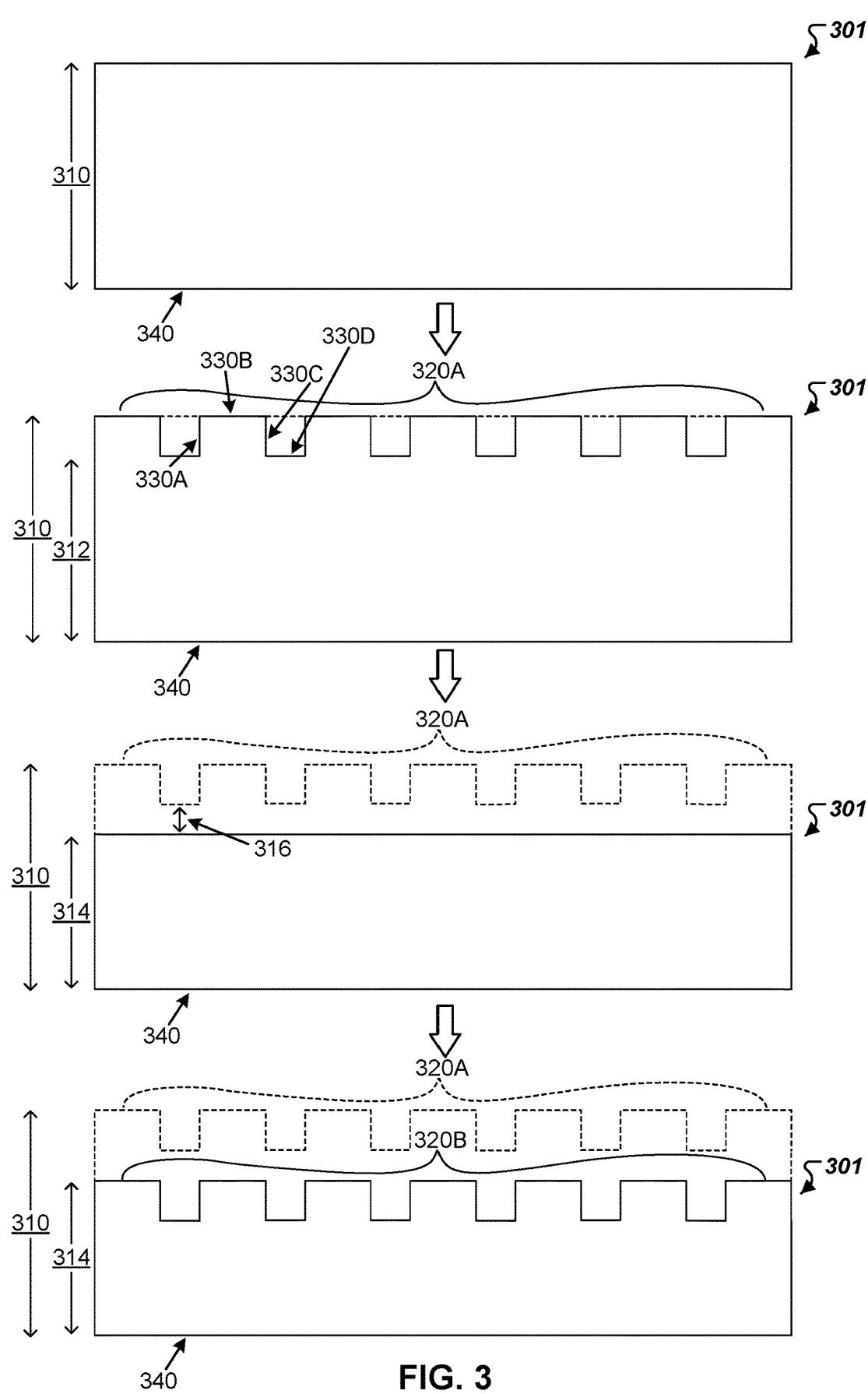
FIG. 3 illustrates laser material processing of a ceramic plate, according to some embodiments.

FIG. 3 illustrates laser material processing of a ceramic plate, according to some embodiments.

In some embodiments, a ceramic plate 301 of a substrate support system (e.g., an electrostatic chuck) can have an initial thickness 310. By performing laser material processing on ceramic plate 301, a set of features 320A can be formed on the surface of ceramic plate 301. Following formation of set of features 320A ceramic plate 301 maintains initial thickness 310 (e.g., from a ceramic plate base 340 to a top of ceramic plate). From the base of the features (e.g., surface 330D) to a ceramic plate base 340 ceramic plate 301 has a thickness 312.

Due to repeated thermal cycling of ceramic plate 301, set of features 320A can become worn, damaged and degraded. In some embodiments, ceramic plate and set of features 320A can be refurbished using laser material processing. For example, laser material processing can be used to remove set of features 320A from ceramic plate 301, or portions of features 320A. In some embodiments, an additional portion 316 of ceramic plate is removed. Following removal of set of features 320A and additional portion 316, the ceramic plate has a thickness 314. In some embodiments, additional portion 316 is the difference between thickness 312 and thickness 314.

The additional portion removed 316 can be, for example, less than 40 micrometers (e.g., 1 micrometer). By removing less material, more refurbishment cycles can be completed during the lifetime of ceramic plate 301. For example, ceramic plate 301 can be refurbished up to ten times. However, when using conventional machining and mechanical grinding to remove set of features 320, the additional portion removed can be greater than 40 micrometers. This can limit refurbishment of the ceramic plate 301 to two refurbishment cycles.

Once set of features 320A has been removed, a new feature pattern including set of features 320B can be formed on the surface of the ceramic plate 301.

In some embodiments, features of set features 320 have surfaces (e.g., surface 330A, surface 330B, and surface 330C). Surfaces of a feature or set of features 320 can have different textures, shapes or roughness in embodiments. Texturing of surfaces can be created by adjusting laser processing parameters of laser material processing operations. Surfaces between features such as mesas can be textured. For example, surface 330D between two mesas can have texture created by laser material processing operations. In some embodiments, surface treatments or surface texturing can include a varying degree of roughness. For example, a mesa sidewall (e.g., surfaces 330A and 330C) may have a rough surface, while the top surface of a mesa (e.g., surface 330B) has a relatively smooth surface. The surface of the initial ceramic plate (e.g., puck) can have a uniform roughness across the surface. In some embodiments, a smooth surface can prevent residual charges from accumulating.

Laser tuning parameters for creating varied surface textures can include average power, pulse energy, pulse duration, dwell time, repetition rate, hatch distance, hatch type, rastering type, milling strategy (e.g., to tune the surface roughness), and/or the like. Rastering can refer to techniques of moving a laser beam in a pattern (e.g., a back-and-forth pattern) across a surface of a material to modify the material according to a specific design, such as in engraving or additive manufacturing. In some embodiments, rastering movement can be achieved through galvo-scanner systems and/or movable wedge systems. Galvo systems can utilize fast-moving mirrors mounted on galvo-scanners to swiftly direct a laser beam in a desired pattern. Movable wedge systems can involve the physical movement of either the laser head or the material itself (e.g., through linear actuators or motors) to create the raster pattern. In some embodiments, a scan head of a laser material processing system may include an F-Theta lens to yield a specified beam spot size.

Figures 4A, 4B:
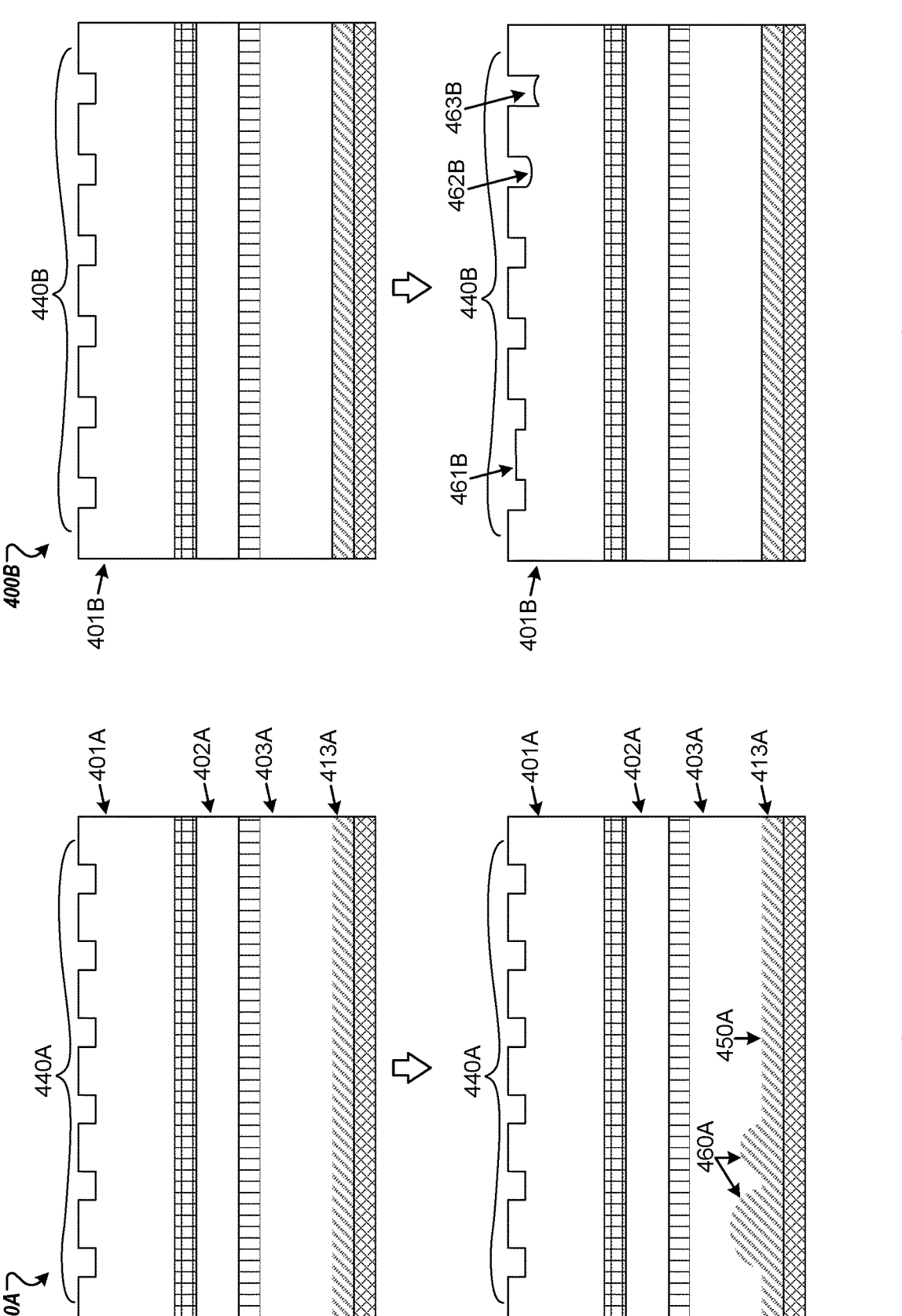
FIGS. 4A-B illustrate laser material processing of a ceramic plate of a substrate support system based on performance data, according to some embodiments.

FIGS. 4A-B illustrate laser material processing of a ceramic plate of a substrate support system based on performance data, according to some embodiments.

Referring to FIG. 4A, in some embodiments, a substrate support system 400A can include a first ceramic plate 401A (e.g., having a set of features 440A), a second ceramic plate 402A, and a third ceramic plate 403A. In some embodiments, substrate support systems 400A and 400B can be an exemplary electrostatic chuck with multiple ceramic plates. In some embodiments, a single ceramic can include multiple elements (e.g., a clamp electrode, heater, etc.)

By determining performance data of the substrate support system, a target profile for a bottom surface one of the ceramic plates 401A-403A of can be determined based on the determined performance data. The performance data can be, for example, a thermal profile of substrate support system 400A or a thermal profile of a substrate held by substrate support system 400A. To determine performance data, in some embodiments, a test substrate may be processed and heat measurements can be taken of the substrate support system 400A and/or the test substrate during the processing.

In some embodiments, a predetermined texture shape (target profile) can be simulated based on either a measured thermal response of a substrate, the substrate support assembly, or chamber parameters. In some embodiments, material can be removed from a bottom most interface of the substrate support system to meet a desired temperature profile.

In some embodiments, the target profile can be a surface profile of one of the ceramic plates 401A-403A. Surfaces of the target profile can be a freeform polynomial shape or a linear approximation of a freeform polynomial shape. In some embodiments, laser material processing can be performed to remove material from, for example, a bottom surface 450A of ceramic plate 403A based on the determined performance data. Such shaping of bottom surface 450A via laser material processing can form features 460A to regulate and correct the thermal profile of substrate support system 400A. In some embodiments, bond material 413A can be a flowable material that fills the area formed by material removal via the laser material processing.

Referring to FIG. 4B, in some embodiments, a substrate support system 400B can include a first ceramic plate 401B having a set of features 440B. By determining performance data of the substrate support system, a target profile (e.g., a feature pattern) for a top surface of ceramic plate 401B can be determined based on the determined performance data. The performance data can be, for example, a thermal profile of substrate support system 400B or a thermal profile of a substrate held by substrate support system 400B. To determine performance data, in some embodiments, a test substrate may be processed and heat measurements can be taken of the substrate support system 400B and/or the test substrate during the processing.

In some embodiments, a predetermined texture shape (target profile) can be simulated based on either a measured thermal response of a substrate, the substrate support assembly, or chamber parameters. In some embodiments, material can be removed from a topmost surface of the substrate support system to meet a desired temperature profile.

In some embodiments, the target profile can be a surface profile of one of the ceramic plates 401A-403A. Surfaces of the target profile can be a freeform polynomial shape or a linear approximation of a freeform polynomial shape. Laser material processing can be performed to remove material from the set of features 440B of ceramic plate 401B based on the determined performance data. Such shaping of set of features 440B can refine the features to regulate and correct the thermal profile of substrate support system 400A. In some embodiments, laser material processing can be performed to remove material from a feature. For example, material was removed from the top of feature 461B making it shorter than the other features of set of features 440B. In some embodiments, the laser material processing can be performed to remove material between features of the set of features 440B. For example, removal area 462B is a concave shape and removal area 463B. In some embodiments, when the laser material processing begins with a featureless ceramic plate, some of the regions between features can have less material removed, resulting in shallower trenches between features.

Figure 5:
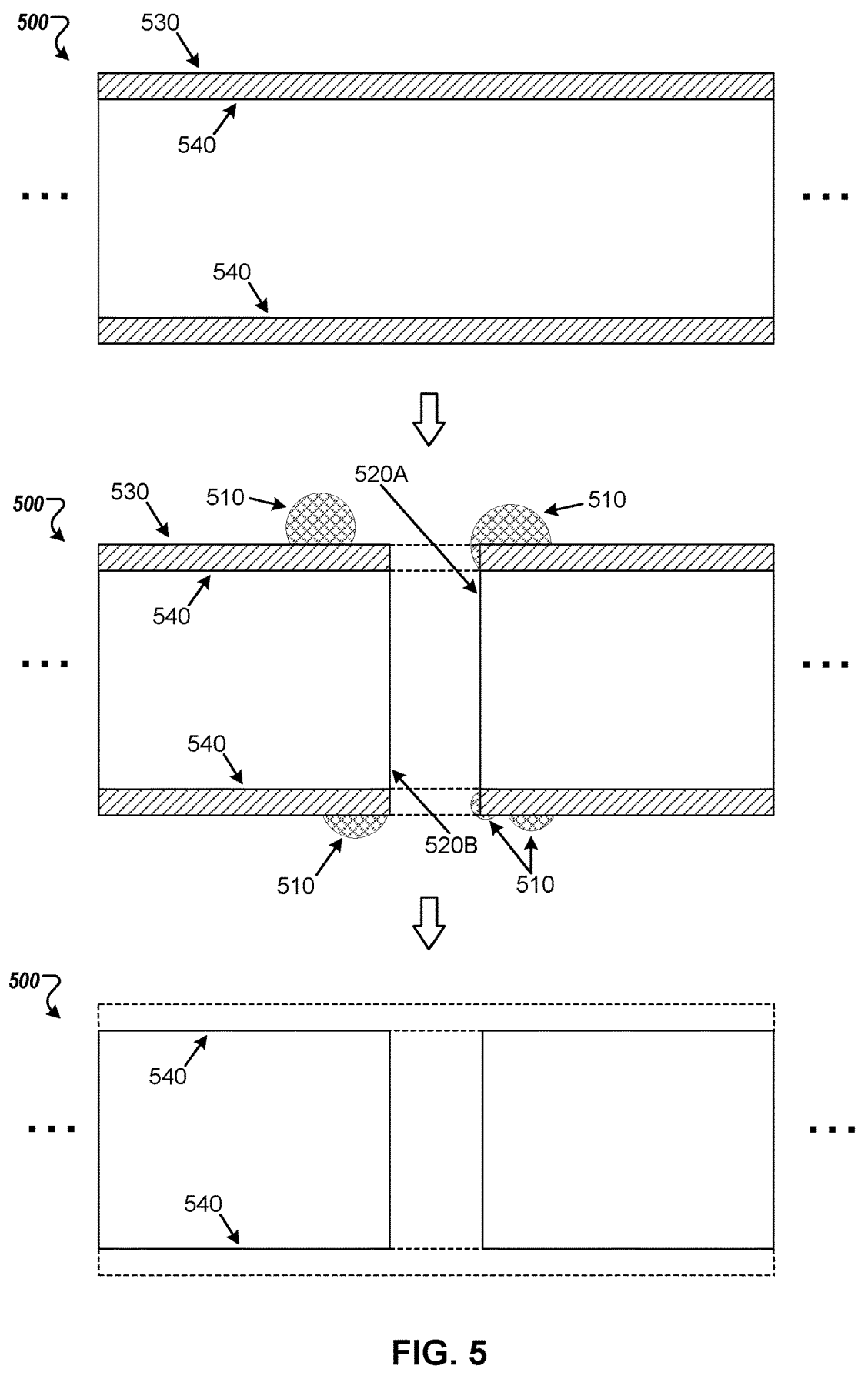

FIG. 5 illustrates applying a solvent soluble film to the surface of a ceramic plate of a substrate support prior to performing laser material processing on the ceramic plate, according to some embodiments.

In some embodiments, laser material processing can lead to the accumulation of debris 510 around boundary regions 520A and 520B on surfaces 540 of ceramic plate 500. In some embodiments, before performing laser material processing of ceramic plate 500 to form a feature (e.g., a hole), a solvent soluble film 530 can be applied to the surfaces 540 of ceramic plate. Following the laser material processing debris 510 can accumulation around boundary regions 520A and 520B. By rinsing solvent soluble film 530 with a solvent both solvent soluble film 530 and debris 510 can be removed from the surfaces 540 of ceramic plate 500, creating surfaces free of debris with the desired degree of smoothness.

In some embodiments, water-soluble polymers can be, for example, polyethylene glycol, polyacrylamides, polyacrylic acid copolymer, polyvinyl alcohol, and/or the like.

In some embodiments, the water soluble polymers can be organic polymers that dissolve, disperse, or swell in water and consequently change the physical properties of aqueous systems undergoing gelation or thickening. For example, polyvinyl alcohol (PVA) is hydrophilic water-soluble synthetic polymer where the hydroxyl group is a repeating unit that is cross-linkable with interconnected hydrogen bonding.

FIG. 6 is a block diagram illustrating an exemplary system 600 (exemplary system architecture), according to certain embodiments. The system 600 can include a client device 620, manufacturing equipment 624, sensors 626, a design generation system 610, and a data store 640. In some embodiments, the design generation system 610 includes a design generation server 612. In some embodiments, the design generation system 610 further includes server machines 670 and 680.

In some embodiments, one or more of the client device 620, manufacturing equipment 624, sensors 626, design generation server 612, data store 640, server machine 670, and/or server machine 680 are coupled to each other via a network 630 for generating predictive data 660 to generate designs (e.g., feature patterns) and perform laser material processing to create features on a ceramic plate of a substrate support system. In some embodiments, network 630 is a public network that provides client device 620 with access to the design generation server 612, data store 640, and other publicly available computing devices. In some embodiments, network 630 is a private network that provides client device 620 access to manufacturing equipment 624, sensors 626, data store 640, and other privately available computing devices. In some embodiments, network 630 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

Manufacturing equipment 624 can produce products, such as substrates, wafers, semiconductors, electronic devices, etc., following a recipe or a process. In some embodiments, a processing chamber can include sensors (e.g., sensors 626) configured to generate in-situ sensor measurement values (e.g., sensor data) during a process performed at processing chamber. For example, sensor 626 can gather temperature profile data (e.g., a thermal response profile) of a substrate support system during a process step. The sensors can be operatively coupled to the system controller. In some embodiments, the sensors can be configured to generate a sensor measurement values during particular instances of a processing operation.

The system controller can, for example, generate a thermal response profile based on sensor values from the from the sensors 626. In some embodiments, thermal profile data (e.g., thermal response data) can represent the temperature distribution across a substrate support system or directly on the substrate positioned on the support system during semiconductor manufacturing processes. Thermal profile data can be visualized as a heat map, showing varying temperatures across different regions. Thermal profile data can be visualized as a collection of discrete temperature readings. In some embodiments, thermal profile data can be gathered by embedded temperature sensors (e.g., sensors 626) throughout a processing operation. Thermal profile data can be used to monitoring the uniform application of heat or cooling, helping to ensure process consistency, material integrity, and the quality of the fabricated semiconductor devices. Sensors 626 may additionally or alternatively include a metrology device, such as a reflectometry device that measures a surface (e.g., film thickness) of a substrate processed using a substrate support. A thickness profile or other surface profile of the substrate may be determined from the metrology data, which may correlate to a temperature profile.

By improving thermal profile data (e.g., using design generation based on performance data), the process consistency, material integrity, and the quality of the fabricated devices can be improved. By analyzing thermal profile data, hotspots can be identified (e.g., of a substrate support system) and a target profile for a bottom surface and/or top surface of a ceramic plate of a substrate support system can be determined. Laser material processing can be performed to remove material from the bottom surface and/or top surface of the ceramic plate, change a surface pattern, change one or more features on a ceramic plate, etc. to help ensure uniform thermal treatment, improve process parameters, and enhance the overall efficiency and outcome of the manufacturing process. Using thermal profile data to improve feature designs and surface profiles not only aids in real-time process adjustments but also contributes to the predictive maintenance of the equipment, prolonging the operational lifespan of substrate support systems and ensuring the reliability of the manufacturing system.

In some embodiments, the data store 640 is memory (e.g., random access memory), a drive (e.g., a hard drive, a flash drive), a database system, or another type of component or device capable of storing data. In some embodiments, data store 640 includes multiple storage components (e.g., multiple drives or multiple databases) that span multiple computing devices (e.g., multiple server computers).

In some embodiments, the manufacturing equipment 624 (e.g., deposition chamber, etch chamber, and/or the like) is part of a substrate processing system (e.g., integrated processing system). The manufacturing equipment 624 includes one or more of a controller, an enclosure system (e.g., substrate carrier, front opening unified pod (FOUP), a factory interface (e.g., equipment front end module (EFEM)), a load lock, a transfer chamber, one or more processing chambers, a robot arm (e.g., disposed in the transfer chamber, disposed in the front interface, etc.), and/or the like. In some embodiments, the manufacturing equipment 624 includes components of substrate processing systems.

In some embodiments, the client device 620 includes a computing device such as Personal Computers (PCs), laptops, mobile phones, smart phones, tablet computers, netbook computers, etc. In some embodiments, the client device 620 includes a design generation component 614. In some embodiments, the design generation component 614 is included in the design generation system 610 (e.g., instead of being included in client device 620). Client device 620 includes an operating system that can allow users to consolidate, generate, view, or edit data, provide directives to the design generation system 610 (e.g., machine learning processing system), etc.

In some embodiments, design generation component 614 receives one or more of user input (e.g., via a graphical user Interface (GUI) displayed on the client device 620), performance data 652, temperature profile data, surface profile data, thickness profile data, etc. In some embodiments, design generation component 614 transmits data (e.g., user input, performance data 652, temperature profile data, surface profile data, thickness profile data, etc.) to the design generation system 610, receives design generation data 660 from the design generation system 610, and outputs at least one of an updated feature pattern (e.g., design data 642 based on design generation data 660) or values for one or more laser material processing parameters to be used for performing additional laser material processing based on the design generation data 660. In some embodiments, the design generation component 614, stores data (e.g., user input, design data 642, performance data 652, temperature profile data, etc.) in the data store 640 and the design generation server 612 retrieves the data from the data store 640. In some embodiments, the design generation server 612 stores output data (e.g., design generation data 660) of the trained machine learning model 690 in the data store 640 and the client device 620 retrieves the output from the data store 640.

In some embodiments, design data 642 can be, for example, data representing the current design (e.g., feature pattern) of a ceramic plate of a substrate support system. In some embodiments, design data 642 can be, for example, property data of a ceramic plate of a substrate support system (e.g., including dimensions, surface roughness, etc.). In some embodiments, performance data 652 can be, for example, data representing a thermal profile of the ceramic plate and/or a substrate supported by the substrate support system.

In some embodiments, the design generation server 612, server machine 670, and server machine 680 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The design generation server 612 can include a design generation component 614. In some embodiments, the design generation component 614 identifies (e.g., receives from the client device 620, retrieve from the data store 640) performance data 652 (e.g., temperature profile data) and generates design generation data 660 associated with feature design (e.g., a feature pattern), feature refinement, target profile creation, etc. In some embodiments, the design generation component 614 uses one or more trained machine learning models 690 to determine the design generation data 660. In some embodiments, trained machine learning model 690 is trained using historical design data 644 (e.g., historical feature pattern data) and historical performance data 654 (e.g., historical thermal profile data). In some embodiments, design generation includes determining feature patterns, refinement of existing feature patterns, determining laser material processing parameters for laser material processing, determining a target profile for a bottom surface of the ceramic plate or an additional ceramic plate of the substrate support system, etc.

In some embodiments, design generation, for example, based on performance data 652, may be done using a machine learning model (e.g., machine learning model 690). In some embodiments, the design generation system 610 (e.g., design generation server 612, design generation component 614) generates design generation data 660 using supervised machine learning (e.g., supervised data set, historical performance data 654 labeled with historical design data 644, etc.). In some embodiments, the design generation system 610 generates design generation data 660 using semi-supervised learning (e.g., semi-supervised data set, design data 642, etc.). In some embodiments, the design generation system 610 generates design generation data 660 using unsupervised machine learning (e.g., unsupervised data set, clustering, clustering based on historical performance data 654, etc.).

In some embodiments, the sensors 626 collect performance data 652 (e.g., thermal profile data, such as historical temperature sensor values and current temperature sensor values) of the substrate support system and/or a substrate supported by the substrate support system. In some embodiments, the performance data 652 (e.g., historical performance data 654, current performance data 656, etc.) is processed, e.g., by the client device 620 and/or by the design generation server 612. In some embodiments, processing of the performance data 652 includes generating feature pattern designs and/or target profiles. In some embodiments, the feature pattern designs can be a refinement to an existing feature pattern design (e.g., design data) of a ceramic plate of a substrate support system.

In some embodiments, the data store 640 stores one or more of performance data 652, design data 642, and/or design generation data 660. In some embodiments, data store 640 can be configured to store data that is not accessible to a user of the manufacturing system. For example, performance data, design data, process data, contextual data, etc. obtained for a substrate support system of the manufacturing system is not accessible to a user (e.g., an operator) of the manufacturing system.

Performance data 652 may include historical performance data 654 and current performance data 656. In some embodiments, design data 642 may include feature data, feature pattern data, profile data (e.g., a target profile for a bottom surface of a ceramic plate), laser material processing parameter values, and/or the like.

In some embodiments, historical data includes one or more of historical design data 644 and/or historical performance data 654 (e.g., at least a portion for training the machine learning model 690). Current data may include one or more of current design data 646 and/or current performance data 656 (e.g., at least a portion to be input into the trained machine learning model 690 subsequent to training the model 690 using the historical data). In some embodiments, the current data is used for retraining the trained machine learning model 690.

By providing performance data 652 to model 690 and receiving design generation data 660 from the model 690, and using such output of the model 690 to update a feature pattern and/or surface profile of a ceramic plate of a substrate support, system 600 has the technical advantage of enhancing thermal management, enabling even heat distribution and improving process uniformity and device quality.

In some embodiments, design generation system 610 further includes server machine 670 and server machine 680. Server machine 670 includes a data set generator 672 that is capable of generating data sets (e.g., a set of data inputs and a set of target outputs) to train, validate, and/or test a machine learning model(s) 690. The data set generator 672 has functions of data gathering, compilation, reduction, and/or partitioning to put the data in a form for machine learning. In some embodiments (e.g., for small datasets), partitioning (e.g., explicit partitioning) for post-training validation is not used. Repeated cross-validation (e.g., 5-fold cross-validation, leave-one-out-cross-validation) may be used during training where a given dataset is in-effect repeatedly partitioned into different training and validation sets during training. A model (e.g., the best model, the model with the highest accuracy, etc.) may be chosen from vectors of models over automatically separated combinatoric subsets. In some embodiments, the data set generator 672 may explicitly partition the historical data (e.g., historical performance data 654 and corresponding historical design data 644) into a training set (e.g., sixty percent of the historical data), a validating set (e.g., twenty percent of the historical data), and a testing set (e.g., twenty percent of the historical data).

Some operations of data set generator 672 is described in detail below with respect to FIG. 7 according to some embodiments. In some embodiments, the design generation system 610 (e.g., via design generation component 614) generates multiple sets of features (e.g., training features). In some examples a first set of features corresponds to a first set of types of performance data (e.g., from a first set of sensors, first combination of values from first set of sensors, first patterns in the values from the first set of sensors) that correspond to each of the data sets (e.g., training set, validation set, and testing set) and a second set of features correspond to a second set of types of performance data (e.g., from a second set of sensors different from the first set of sensors, second combination of values different from the first combination, second patterns different from the first patterns) that correspond to each of the data sets.

Server machine 680 includes a training engine 682, a validation engine 684, selection engine 685, and/or a testing engine 686. In some embodiments, an engine (e.g., training engine 682, a validation engine 684, selection engine 685, and a testing engine 686) refers to hardware (e.g., circuitry, dedicated logic, programmable logic, microcode, processing device, etc.), software (such as instructions run on a processing device, a general-purpose computer system, or a dedicated machine), firmware, microcode, or a combination thereof. The training engine 682 is capable of training a machine learning model 690 using one or more sets of features associated with the training set from data set generator 672. In some embodiments, the training engine 682 generates multiple trained machine learning models 690, where each trained machine learning model 690 corresponds to a distinct set of parameters of the training set (e.g., performance data 652) and corresponding responses (e.g., design data 642 and/or design generation data 660). In some embodiments, multiple models are trained on the same parameters with distinct targets for the purpose of modeling multiple effects. In some examples, a first trained machine learning model was trained using performance data 642 from a set of substrate support systems (e.g., substrate support system 1-5), a second trained machine learning model was trained using a first subset of the performance data (e.g., from substrate support system 1, 2, and 4), and a third trained machine learning model was trained using a second subset of the performance data (e.g., from substrate support systems 1, 3, 4, and 5) that partially overlaps the first subset of features.

The validation engine 684 is capable of validating a trained machine learning model 690 using a corresponding set of features of the validation set from data set generator 672. For example, a first trained machine learning model 690 that was trained using a first set of features of the training set is validated using the first set of features of the validation set. The validation engine 684 determines an accuracy of each of the trained machine learning models 690 based on the corresponding sets of features of the validation set. The validation engine 684 evaluates and flags (e.g., to be discarded) trained machine learning models 690 that have an accuracy that does not meet a threshold accuracy. In some embodiments, the selection engine 685 is capable of selecting one or more trained machine learning models 690 that have an accuracy that meets a threshold accuracy. In some embodiments, the selection engine 685 is capable of selecting the trained machine learning model 690 that has the highest accuracy of the trained machine learning models 690.

The testing engine 686 is capable of testing a trained machine learning model 690 using a corresponding set of features of a testing set from data set generator 672. For example, a first trained machine learning model 690 that was trained using a first set of features of the training set is tested using the first set of features of the testing set. The testing engine 686 determines a trained machine learning model 690 that has the highest accuracy of all of the trained machine learning models based on the testing sets.

In some embodiments, the machine learning model 690 (e.g., used for classification) refers to the model artifact that is created by the training engine 682 using a training set that includes data inputs and corresponding target outputs (e.g., correctly classifies a condition or ordinal level for respective training inputs). Patterns in the data sets can be found that map the data input to the target output (the correct classification or level), and the machine learning model 690 is provided mappings that captures these patterns. In some embodiments, the machine learning model 690 uses one or more of Gaussian Process Regression (GPR), Gaussian Process Classification (GPC), Bayesian Neural Networks, Neural Network Gaussian Processes, Deep Belief Network, Gaussian Mixture Model, or other Probabilistic Learning methods. Non probabilistic methods may also be used including one or more of Support Vector Machine (SVM), Radial Basis Function (RBF), clustering, Nearest Neighbor algorithm (k-NN), linear regression, random forest, neural network (e.g., artificial neural network), etc. In some embodiments, the machine learning model 690 is a multivariate analysis (MVA) regression model.

Design generation component 614 provides current performance data 656 (e.g., as input) to the trained machine learning model 690 and runs the trained machine learning model 690 (e.g., on the input to obtain one or more outputs). The design generation component 614 is capable of determining (e.g., extracting) design generation data 660 from the trained machine learning model 690 and determines (e.g., extracts) uncertainty data that indicates a level of credibility that the design generation data 660 corresponds to current design data 646. In some embodiments, the design generation component 614 or design generation component 614 use the uncertainty data (e.g., uncertainty function or acquisition function derived from uncertainty function) to decide whether to use the design generation data 660 to generate a design or whether to further train the model 690.

For purpose of illustration, rather than limitation, aspects of the disclosure describe the training of one or more machine learning models 690 using historical data (e.g., prior data, historical design data 644 and historical performance data 654) and providing current performance data 656 into the one or more trained probabilistic machine learning models 690 to determine design generation data 660. In other implementations, a heuristic model or rule-based model is used to determine design generation data 660 (e.g., without using a trained machine learning model). In other implementations non-probabilistic machine learning models may be used. Design generation component 614 monitors historical performance data 654 and historical design data 644. In some embodiments, any of the information described with respect to data inputs 710 of FIG. 7 are monitored or otherwise used in the heuristic or rule-based model.

In some embodiments, the functions of client device 620, design generation server 612, server machine 670, and server machine 680 are to be provided by a fewer number of machines. For example, in some embodiments, server machines 670 and 680 are integrated into a single machine, while in some other embodiments, server machine 670, server machine 680, and design generation server 612 are integrated into a single machine. In some embodiments, client device 620 and design generation server 612 are integrated into a single machine.

In general, functions described in one embodiment as being performed by client device 620, design generation server 612, server machine 670, and server machine 680 can also be performed on design generation server 612 in other embodiments, if appropriate. In addition, the functionality attributed to a particular component can be performed by different or multiple components operating together. For example, in some embodiments, the design generation server 612 generates designs based on the design generation data 660. In another example, client device 620 determines the design generation data 660 based on data received from the trained machine learning model.

In addition, the functions of a particular component can be performed by different or multiple components operating together. In some embodiments, one or more of the design generation server 612, server machine 670, or server machine 680 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of determining design generation data 660 for determining feature patterns or target profiles and performing laser material processing to create features on a ceramic plate of a substrate support system, in some embodiments, the disclosure can also be generally applied to design generation and performing laser material processing in any system and/or manufacturing facility.

Figure 7:
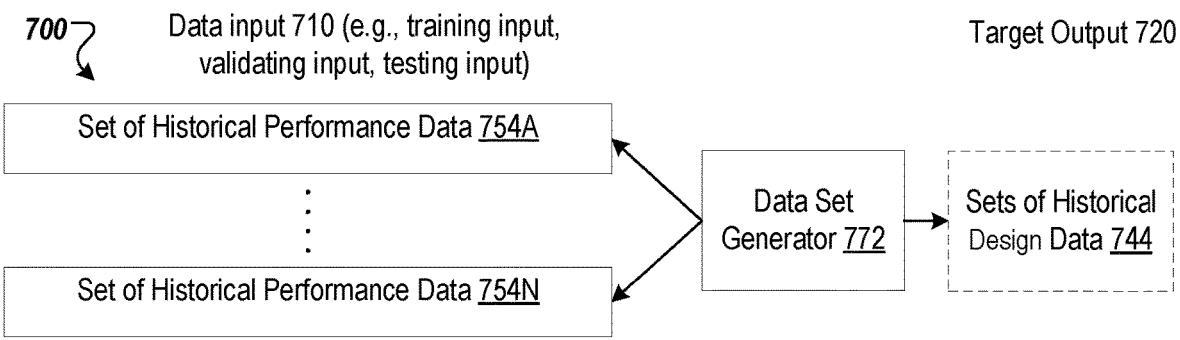
FIG. 7 illustrates a data set generator to create data sets for a machine learning model associated with feature creation on the surface of a ceramic plate of a substrate support system, according to certain embodiments.

FIG. 7 illustrates a data set generator 772 (e.g., data set generator 672 of FIG. 6) to create data sets for a machine learning model (e.g., associated with design generation, target profile generation, feature creation on the surface of a ceramic plate of a substrate support system, performing laser material processing to create features on a ceramic plate of a substrate support system, methods 200A-C, etc.) (e.g., model 690 of FIG. 6), according to certain embodiments. In some embodiments, data set generator 772 is part of server machine 670 of FIG. 6. The data sets generated by data set generator 772 of FIG. 7 may be used to train a machine learning model to generate an updated feature pattern or values for one or more laser material processing parameters (e.g., see FIGS. 2A and 2C).

Data set generator 772 creates data sets using historical performance data 754 (e.g., historical performance data 654 of FIG. 6) and historical design data 744 (e.g., historical design data 644 of FIG. 6). System 700 of FIG. 7 illustrates data set generator 772, data inputs 710, and target output 720 (e.g., target data).

In some embodiments, data set generator 772 generates a data set (e.g., training set, validating set, testing set) that includes one or more data inputs 710 (e.g., training input, validating input, testing input). In some embodiments, data set generator 772 does not generate target output (e.g., for unsupervised learning). In some embodiments, data set generator 772 generates one or more target outputs 720 (e.g., for supervised learning) that correspond to the data inputs 710. The data set may also include mapping data that maps the data inputs 710 to the target outputs 720. Data inputs 710 are also referred to as "features," "attributes," or information." In some embodiments, data set generator 772 provides the data set to the training engine 682, validation engine 684, or testing engine 686, where the data set is used to train, validate, or test the machine learning model 690 (e.g., associated with design generation, target profile generation, feature creation on the surface of a ceramic plate, performing laser material processing to create features on a ceramic plate of a substrate support system, methods 200A-C, etc.).

In some embodiments, data set generator 772 generates the data input 710 and target output 720. In some embodiments, data inputs 710 include one or more sets of historical performance data (e.g., historic performance data 654 of FIG. 6) (e.g., thermal profile data) (e.g., associated with design generation, target profile generation, feature creation on the surface of a ceramic plate, performing laser material processing to create features on a ceramic plate of a substrate support system, methods 200A-C, etc.). In some embodiments, historical performance data (e.g., historic performance data 654 of FIG. 6) includes one or more of thermal profile data, temperature distribution data, heat map data, and/or the like.

In some embodiments, data set generator 772 generates a first data input corresponding to a first set of historical performance data 754A to train, validate, or test a first machine learning model and the data set generator 772 generates a second data input corresponding to a second set of historical performance data 754N to train, validate, or test a second machine learning model (e.g., associated with design generation, target profile generation, feature creation on the surface of a ceramic plate, performing laser material processing to create features on a ceramic plate of a substrate support system, methods 200A-C, etc.). In some embodiments, N can be any integer value greater than one.

In some embodiments, the data set generator 772 discretizes (e.g., segments) one or more of the data input 710 or the target output 720 (e.g., to use in classification algorithms for regression problems). Discretization (e.g., segmentation via a sliding window) of the data input 710 or target output 720 transforms continuous values of variables into discrete values. In some embodiments, the discrete values for the data input 710 indicate discrete historical performance data 654 to obtain a target output 720 (e.g., discrete historical design data 644).

Data inputs 710 and target outputs 720 to train, validate, or test a machine learning model include information for a particular facility (e.g., for a particular substrate manufacturing facility). In some examples, historical performance data (e.g., historic performance data 654 of FIG. 6) and historical design data 744 are for the same manufacturing facility (e.g., associated with design generation, target profile generation, feature creation on the surface of a ceramic plate, performing laser material processing to create features on a ceramic plate of a substrate support system, methods 200A-C, etc.).

In some embodiments, the information used to train the machine learning model is from specific types of manufacturing equipment 624 of the manufacturing facility (e.g., specific substrate support systems in certain processing chambers) having specific characteristics and allow the trained machine learning model (e.g., associated with design generation, target profile generation, feature creation on the surface of a ceramic plate, performing laser material processing to create features on a ceramic plate of a substrate support system, methods 200A-C, etc.) to determine outcomes for a specific group of manufacturing equipment 624 based on input for current parameters (e.g., current performance data 656) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 690 using the data set, the machine learning model 690 (e.g., associated with design generation, target profile generation, feature creation on the surface of a ceramic plate, performing laser material processing to create features on a ceramic plate of a substrate support system, methods 200A-C, etc.) is further trained, validated, or tested (e.g., with current design data 656 of FIG. 6) or adjusted (e.g., adjusting weights associated with input data of the machine learning model 690, such as connection weights in a neural network).

The machine learning model processes the input to generate an output (e.g., associated with design generation, target profile generation, feature creation on the surface of a ceramic plate, performing laser material processing to create features on a ceramic plate of a substrate support system, methods 200A-C, etc.). An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine learning model can produce.

Accordingly, the output can include one or more predictions or inferences (e.g., associated with design generation, target profile generation, feature creation on the surface of a ceramic plate, performing laser material processing to create features on a ceramic plate of a substrate support system, methods 200A-C, etc.). For example, an output prediction or inference can include one or more predictions of a target design, target profile, desired feature creation on the surface of a ceramic plate, target parameters for performing laser material processing to create features on a ceramic plate of a substrate support system, and so on. Processing logic determines an error (e.g., a classification error) based on the differences between the output (e.g., predictions or inferences) of the machine learning model and target labels associated with the input training data. Processing logic adjusts weights of one or more nodes in the machine learning model based on the error. An error term or delta can be determined for each node in the artificial neural network.

Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of "neurons," where each layer receives input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In some embodiments, the stopping criterion is met when at least a minimum number of data points have been processed and at least a threshold accuracy is achieved. The threshold accuracy can be, for example, 70%, 80%, or 90% accuracy. In some embodiments, the stopping criterion is met if an accuracy of the machine learning model has stopped improving. If the stopping criterion has not been met, further training is performed. If the stopping criterion has been met, training can be completed. Once the machine learning model is trained, a reserved portion of the training dataset can be used to test the model.

Figure 8:
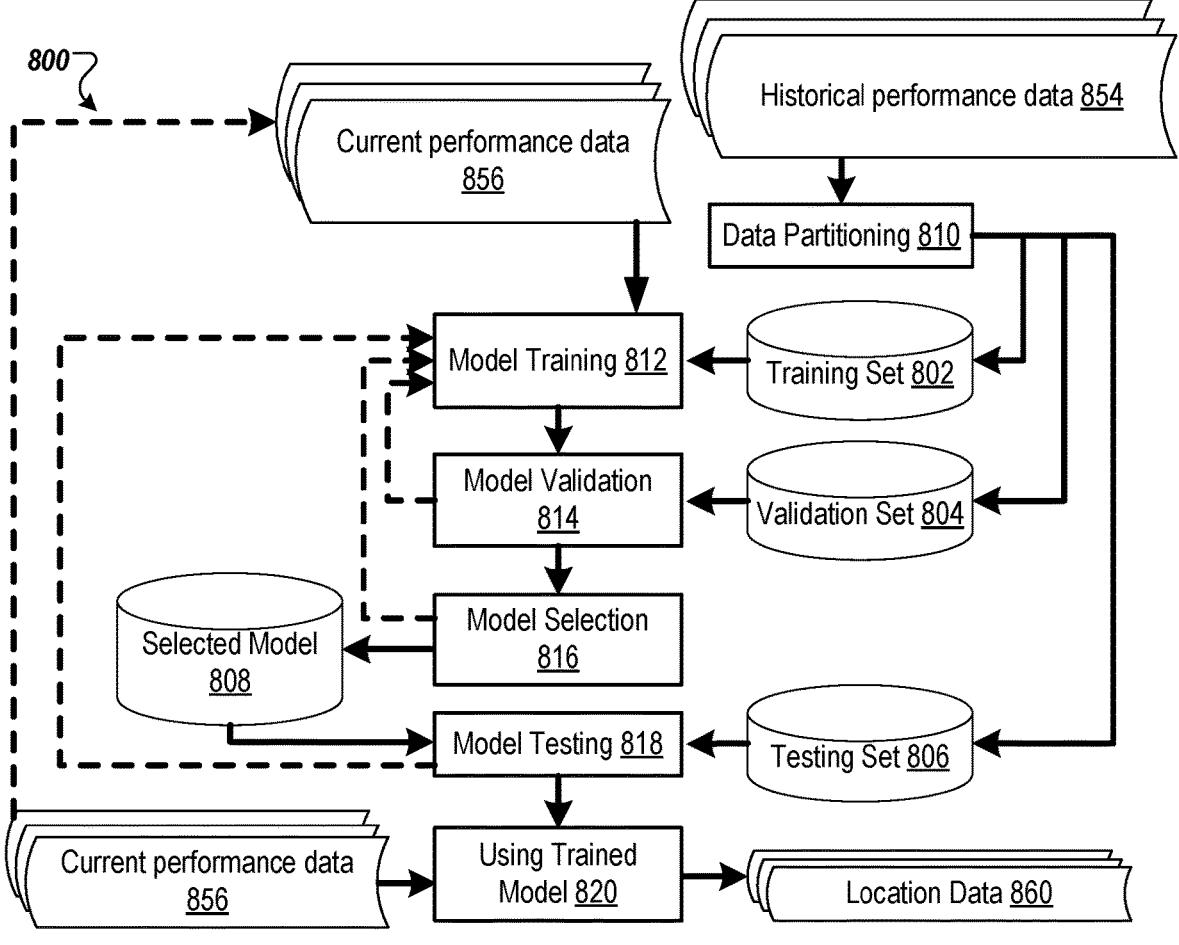
FIG. 8 is a block diagram illustrating determining design data associated with feature creation on the surface of a ceramic plate of a substrate support system, according to certain embodiments.

FIG. 8 is a block diagram illustrating determining design data associated with feature creation on the surface of a ceramic plate of a substrate support system, according to certain embodiments. The system 800 can generate design data using a trained machine learning model (e.g., associated design generation, target profile generation, feature creation on the surface of a ceramic plate, performing laser material processing to create features on a ceramic plate of a substrate support system, methods 200A-C, etc.) (e.g., model 690 of FIG. 6).

At block 810, the system 800 (e.g., design generation system 610 of FIG. 6) begins preparation of training data for the machine learning model by performing data partitioning (e.g., via data set generator 672 of server machine 670 of FIG. 6) of the historical data (e.g., historical performance data 854 and/or historical design data 644 for model 690 of FIG. 6) to generate the training set 802, validation set 804, and testing set 806 (e.g., associated with design generation, target profile generation, feature creation on the surface of a ceramic plate, performing laser material processing to create features on a ceramic plate of a substrate support system, methods 200A-C, etc.). In some examples, the training set is 60% of the historical data, the validation set is 20% of the historical data, and the testing set is 20% of the historical data. The system 800 generates a plurality of sets of features for each of the training set, the validation set, and the testing set. In some examples, if the historical data includes features derived from 20 sensors (e.g., sensors 626 of FIG. 6) and 600 chambers and/or tools (e.g., chambers and/or tools that each correspond to performance data from the 20 sensors), a first set of features is sensors 1-10, a second set of features is sensors 11-20, the training set is products 1-60, the validation set is products 61-80, and the testing set is products 81-100. In this example, the first set of features of the training set would be parameters from sensors 1-10 for products 1-60.

At block 812, the system 800 performs model training (e.g., via training engine 682 of FIG. 6 associated with design generation, target profile generation, feature creation on the surface of a ceramic plate, performing laser material processing to create features on a ceramic plate of a substrate support system, methods 200A-C, etc.) using the training set 802. In some embodiments, the system 800 trains multiple models using multiple sets of features of the training set 802 (e.g., a first set of features of the training set 802, a second set of features of the training set 802, etc.). For example, system 800 trains a machine learning model to generate a trained machine learning model using a set of features in the training set.

At block 814, the system 800 performs model validation (e.g., via validation engine 684 of FIG. 6) using the validation set 804. The system 800 validates each of the trained models (e.g., associated with design generation, target profile generation, feature creation on the surface of a ceramic plate, performing laser material processing to create features on a ceramic plate of a substrate support system, methods 200A-C, etc.) using a corresponding set of features of the validation set 804. For example, system 800 validates the trained machine learning model using the set of features in the validation set. At block 814, the system 800 determines an accuracy of each of the one or more trained models (e.g., via model validation) and determines whether one or more of the trained models have an accuracy that meets a threshold accuracy. Responsive to determining that none of the trained models has an accuracy that meets a threshold accuracy, flow returns to block 812 where the system 800 performs model training using different sets of features of the training set. Responsive to determining that one or more of the trained models has an accuracy that meets a threshold accuracy, flow continues to block 816. The system 800 discards the trained machine learning models that have an accuracy that is below the threshold accuracy (e.g., based on the validation set).

At block 816, the system 800 may perform model selection (e.g., via selection engine 685 of FIG. 6) if multiple models were trained to determine which of the one or more trained models that meet the threshold accuracy has the highest accuracy (e.g., the selected model 808, based on the validating of block 814). Responsive to determining that two or more of the trained models that meet the threshold accuracy have the same accuracy, flow returns to block 812 where the system 800 performs model training using further refined training sets corresponding to further refined sets of features for determining a trained model that has the highest accuracy.

At block 818, the system 800 performs model testing (e.g., via testing engine 686 of FIG. 6) using the testing set 806 to test the selected model 808. The system 800 tests, using the first set of features in the testing set, the trained machine learning model to determine whether the trained machine learning model meets a threshold accuracy (e.g., based on the first set of features of the testing set 806). Responsive to accuracy of the selected model 808 not meeting the threshold accuracy (e.g., the selected model 808 is overly fit to the training set 802 and/or validation set 804 and is not applicable to other data sets such as the testing set 806), flow continues to block 812 where the system 800 performs model training (e.g., retraining) using different training sets corresponding to different sets of features (e.g., performance data from different sensors). Responsive to determining that the selected model 808 has an accuracy that meets a threshold accuracy based on the testing set 806, flow continues to block 820. In at least block 812, the model learns patterns in the historical data to make predictions and in block 818, the system 800 applies the model on the remaining data (e.g., testing set 806) to test the predictions (e.g., associated with design generation, target profile generation, feature creation on the surface of a ceramic plate, performing laser material processing to create features on a ceramic plate of a substrate support system, methods 200A-C, etc.).

At block 820, system 800 uses the trained model (e.g., selected model 808) for design generation. System 800 provides current performance data 856 (e.g., current performance data 656 of FIG. 6) as input to the trained model and obtains, from the trained model, design generation data 860 (e.g., design generation data 660 of FIG. 6) that reflects design generation, where the design generation data indicates design data (e.g., feature patterns, target profiles, etc.). In some embodiments, the current performance data 856 corresponds to the same types of features in the historical performance data 854. In some embodiments, the current performance data 856 corresponds to a same type of features as a subset of the types of features in historical performance data 854 that is used to train the selected model 808 (e.g., associated with design generation, target profile generation, feature creation on the surface of a ceramic plate, performing laser material processing to create features on a ceramic plate of a substrate support system, methods 200A-C, etc.). In some embodiment, the current performance data is represented as a thermal response profile, as discussed in more detail herein.

In some embodiments, system 800 receives user input indicating accuracy of the predicted data, and this information together with the current design data 646 (e.g., of FIG. 6) and the current performance data 856 is used to re-train the machine learning model.

In some embodiments, one or more of the blocks 810-820 occur in various orders and/or with other operations not presented and described herein. In some embodiments, one or more of blocks 810-820 are not to be performed. For example, in some embodiments, one or more of data partitioning of block 810, model validation of block 814, model selection of block 816, and/or model testing of block 818 are not to be performed.

Figure 9:
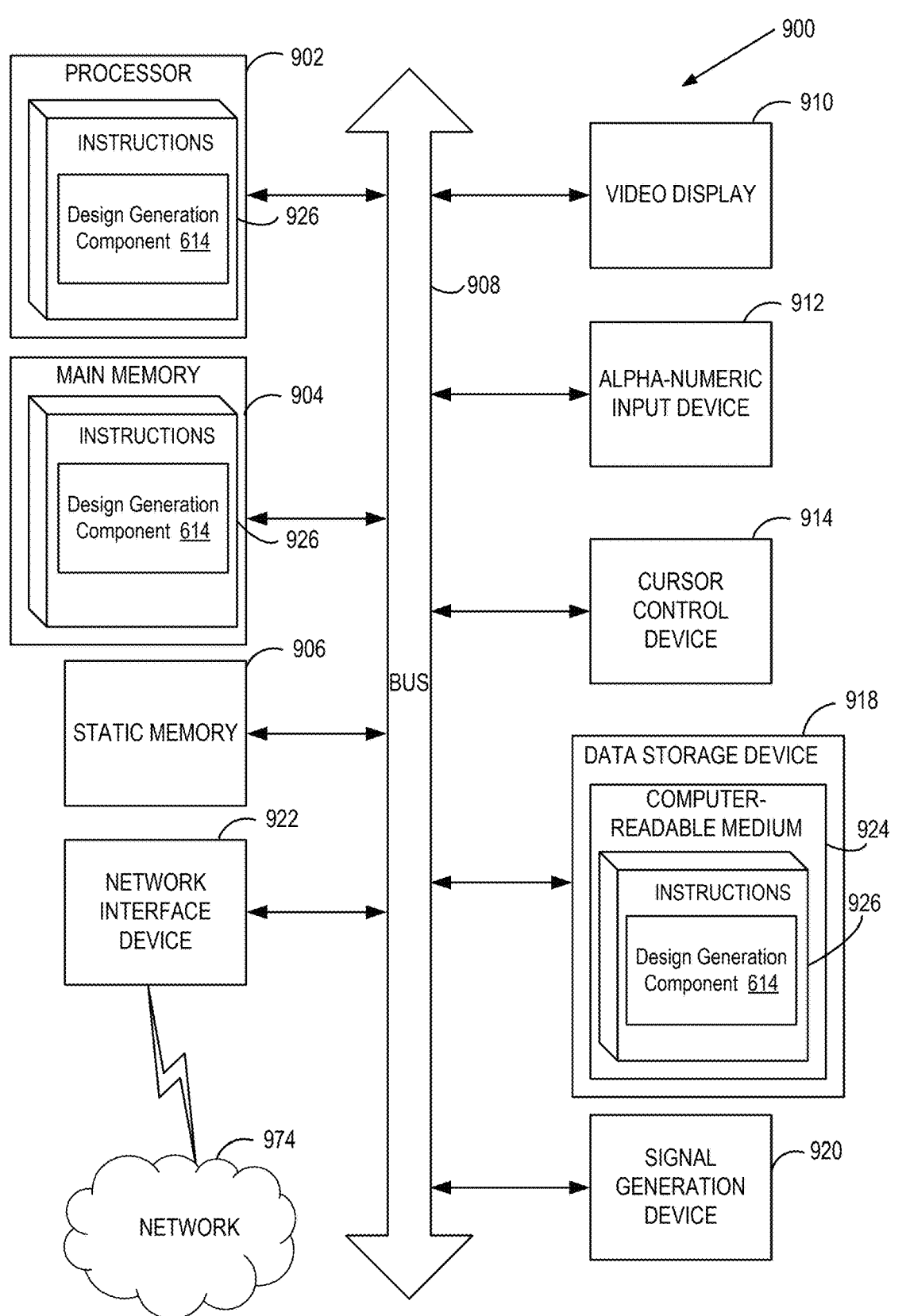
FIG. 9 is a block diagram illustrating a computer system, according to some embodiments.

FIG. 9 is a block diagram illustrating a computer system 900, according to certain embodiments. In some embodiments, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., Random Access Memory (RAM)), a non-volatile memory 906 (e.g., Read-Only Memory (ROM) or Electrically-Erasable Programmable ROM (EEPROM)), and a data storage device 918, which may communicate with each other via a bus 908.

Processing device 902 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 900 may further include a network interface device 922 (e.g., coupled to network 974). Computer system 900 also may include a video display unit 910 (e.g., an LCD), an alphanumeric input device 912 (e.g., a keyboard), a cursor control device 914 (e.g., a mouse), and a signal generation device 920.

In some implementations, data storage device 918 may include a non-transitory computer-readable storage medium 924 (e.g., non-transitory machine-readable storage medium) on which may store instructions 926 encoding any one or more of the methods or functions described herein, including instructions encoding design generation component 614 and for implementing methods described herein.

Instructions 926 may also reside, completely or partially, within volatile memory 904 and/or within processing device 902 during execution thereof by computer system 900, hence, volatile memory 904 and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "determining," "processing," "forming," "applying," "causing," "opening," "closing," "measuring," "calculating," "changing," "receiving," "performing," "providing," "obtaining," "accessing," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
receiving a ceramic plate of a substrate support system;
determining a feature pattern for a surface of the ceramic plate;
performing laser material processing of the surface of the ceramic plate to form the feature pattern comprising a plurality of features on the surface of the ceramic plate; and
performing additional laser material processing to refine, based on determined performance data of the substrate support system, the plurality of features of the feature pattern.

2. The method of claim 1, further comprising:
determining the performance data of the substrate support system.

3. The method of claim 2, further comprising:
determining laser material processing parameters for the additional laser material processing based on the performance data, the laser material processing parameters comprising at least one of average power, pulse energy, pulse duration, dwell time, repetition rate, hatch distance, hatch type, or rastering type.

4. The method of claim 2, further comprising:
processing the performance data of the substrate support system using a trained machine learning model that outputs at least one of an updated feature pattern or values for one or more laser material processing parameters to be used for performing the additional laser material processing.

5. The method of claim 4, wherein the trained machine learning model is trained using training input data comprising historical performance data and training target output data comprising historical design data associated with the historical performance data.

6. The method of claim 1, further comprising:
performing laser material processing to remove at least a portion of the plurality of features; and forming a new feature pattern on the surface of the ceramic plate.

7. The method of claim 1, further comprising:
applying a solvent soluble film to the surface of the ceramic plate prior to performing the laser material processing.

8. The method of claim 1, wherein surfaces of one or more features of the plurality of features comprise a freeform polynomial shape or a linear approximation of a freeform polynomial shape.

9. The method of claim 1, wherein surfaces of regions between one or more features of the plurality of features comprise a freeform polynomial shape or a linear approximation of a freeform polynomial shape.

10. The method of claim 1, further comprising:
determining performance data of the substrate support system;
determining a target profile for a bottom surface of the ceramic plate or an additional ceramic plate of the substrate support system based on the determined performance data; and
performing laser material processing to remove material from the bottom surface of the ceramic plate or the additional ceramic plate based on the determined target profile.

11. A method comprising:
receiving a ceramic plate of a substrate support system;
determining a feature pattern for a surface of the ceramic plate;
performing laser material processing of the surface of the ceramic plate to remove at least a portion of a plurality of features of the feature pattern on the surface of the ceramic plate;
performing the laser material processing of the surface of the ceramic plate to form a new feature pattern comprising a plurality of features on the surface of the ceramic plate; and
performing additional laser material processing to refine, based on determined performance data of the substrate support system, the plurality of features of the feature pattern.

12. The method of claim 11, further comprising:
determining the performance data of the substrate support system.

13. The method of claim 12, further comprising:
processing the performance data of the substrate support system using a trained machine learning model that outputs at least one of an updated feature pattern or values for one or more laser material processing parameters to be used for performing the additional laser material processing.

14. The method of claim 13, wherein the trained machine learning model is trained using training input data comprising historical performance data and training target output data comprising historical design data associated with the historical performance data.

15. The method of claim 11, further comprising:
determining performance data of the substrate support system;
determining a target profile for a bottom surface of the ceramic plate or an additional ceramic plate of the substrate support system based on the determined performance data; and
performing laser material processing to remove material from the bottom surface of the ceramic plate or the additional ceramic plate based on the determined target profile.

* * * * *